United States Patent
Lee et al.

(10) Patent No.: US 7,893,719 B2
(45) Date of Patent: Feb. 22, 2011

(54) APPARATUS AND METHODS FOR SELF-BIASING DIFFERENTIAL SIGNALING CIRCUITRY HAVING MULTIMODE OUTPUT CONFIGURATIONS FOR LOW VOLTAGE APPLICATIONS

(75) Inventors: Chihou Lee, Kanata (CA); Junho Cho, Concord (CA)

(73) Assignee: ATI Technologies, ULC, Markham, Ontario ( * ) Notice: Subject to any disclaimer, the term of this patent is extended or adjusted under 35 U.S.C. 154(b) by 0 days.

(21) Appl. No.: 11/951,447

(22) Filed: Dec. 6, 2007

(65) Prior Publication Data

US 2008/0088342 A1 Apr. 17, 2008

Related U.S. Application Data

(63) Continuation-in-part of application No. 11/830,897, filed on Jul. 31, 2007, now Pat. No. 7,495,477, which is a continuation of application No. 11/160,243, filed on Jun. 15, 2005, now Pat. No. 7,253,663.

(51) Int. Cl.
*H03K 19/094* (2006.01)
(52) U.S. Cl. ........................... 326/86; 326/83; 326/115; 326/121; 326/127; 327/108; 327/112
(58) Field of Classification Search ................. 326/127, 326/115, 121; 327/108, 112
See application file for complete search history.

(56) References Cited

U.S. PATENT DOCUMENTS

| | | | |
|---|---|---|---|
| 6,107,882 A * | 8/2000 | Gabara et al. ............... | 330/253 |
| 6,369,621 B1 * | 4/2002 | Tinsley et al. ............... | 327/108 |
| 6,566,911 B1 | 5/2003 | Moyer | |
| 6,580,293 B1 | 6/2003 | Bernstein et al. | |
| 6,586,964 B1 | 7/2003 | Kent et al. | |
| 6,617,892 B2 | 9/2003 | Krishnamurthy et al. | |
| 6,677,802 B2 | 1/2004 | Strom et al. | |
| 6,791,391 B2 | 9/2004 | Nishimura et al. | |
| 6,847,232 B2 * | 1/2005 | Tinsley et al. ................. | 326/84 |

(Continued)

FOREIGN PATENT DOCUMENTS

WO    WO 2005/043769    5/2005

(Continued)

OTHER PUBLICATIONS

Low-Voltage Differential Signaling: The International Engineering Consortium; from Web ProForum Tutorials, www.iec.org; pp. 1-15.

(Continued)

*Primary Examiner*—Vibol Tan
(74) *Attorney, Agent, or Firm*—Vedder Price, P.C.

(57) ABSTRACT

A digital data transmitting device is disclosed having differential signaling circuitry, a current source controller and a pair of transistor-implemented current sources is disclosed. The current source controller generates a current source control signal based on a detected mode of operation of the differential signaling circuitry. The pair of transistor-implemented current sources selectively generate source currents to adjust the output voltage levels as the differential output terminals in response to the current source control signal. The digital data transmitting device may also include a current bulk biasing circuit that generates a current source bulk biasing signal such that when the differential signaling circuitry is in one mode of operation, the current source bulk biasing signal retards currents leakage across the pair of transistor-implemented current sources.

25 Claims, 11 Drawing Sheets

U.S. PATENT DOCUMENTS

| | | |
|---|---|---|
| 6,856,178 B1 | 2/2005 | Narayan |
| 7,061,273 B2 * | 6/2006 | Wang et al. .................. 326/86 |
| 7,123,236 B2 | 10/2006 | Ker et al. |
| 7,215,143 B1 | 5/2007 | Chung et al. |
| 7,228,116 B2 * | 6/2007 | Cheng et al. ............ 455/180.3 |
| 7,253,663 B2 | 8/2007 | Cho et al. |
| 7,256,624 B2 * | 8/2007 | Cheng et al. ................ 327/112 |
| 7,256,625 B2 * | 8/2007 | Liu et al. .................... 327/112 |
| 7,336,780 B2 | 2/2008 | Lim et al. |
| 7,362,138 B1 | 4/2008 | Arsovski et al. |
| 7,403,039 B1 | 7/2008 | Arsovski et al. |
| 7,425,844 B1 | 9/2008 | Chung et al. |
| 7,429,877 B2 | 9/2008 | Arsovski et al. |
| 7,598,779 B1 * | 10/2009 | Wang et al. ................. 327/108 |
| 2002/0190754 A1 | 12/2002 | Brunolli |
| 2003/0094977 A1 | 5/2003 | Li et al. |
| 2006/0284649 A1 | 12/2006 | Cho et al. |
| 2008/0088342 A1 | 4/2008 | Lee et al. |
| 2008/0116943 A1 * | 5/2008 | Nair .......................... 327/108 |
| 2008/0186051 A1 * | 8/2008 | Arsovski et al. .............. 326/37 |
| 2009/0108869 A1 * | 4/2009 | Arsovski et al. .............. 326/38 |

OTHER PUBLICATIONS

Digital Visual Interface (DVI): InFocus Corporation Infocus Proxima; Nov. 2001; pp. 1-15.

Huq, Syed B. et al.; An Overview of LVDS Technology; National Semiconductor Application Note 971; Jul. 1998; pp. 1-6.

International Search Report for International Application No. PCT/CA2008/002072, Feb. 18, 2009, 3 pp.

Written Opinion for International Application No. PCT/CA2008/002072, Feb. 13, 2009, 5 pp.

* cited by examiner

APPARATUS AND METHODS FOR SELF-BIASING DIFFERENTIAL SIGNALING CIRCUITRY HAVING MULTIMODE OUTPUT CONFIGURATIONS FOR LOW VOLTAGE APPLICATIONS

RELATED CO-PENDING APPLICATION

This application is a continuation-in-part of co-pending U.S. application Ser. No. 11/830,897, filed Jul. 31, 2007, now U.S. Pat. 7,495,477, entitled "APPARATUS AND METHODS FOR SELF-BIASING DIFFERENTIAL SIGNALING CIRCUITRY HAVING MULTIMODE OUTPUT CONFIGURATIONS FOR LOW VOLTAGE APPLICATIONS" having as inventors Junho Cho et al., owned by instant assignee and incorporated in its entirety herein by reference, which is a continuation of U.S. application Ser. No. 11/160,243, filed Jun. 15, 2005, now U.S. Pat. 7,253,663, entitled "APPARATUS AND METHODS FOR SELF-BIASING DIFFERENTIAL SIGNALING CIRCUITRY HAVING MULTIMODE OUTPUT CONFIGURATIONS FOR LOW VOLTAGE APPLICATIONS", having as inventors Junho Cho et al., owned by instant assignee and incorporated in its entirety herein by reference.

TECHNICAL FIELD

The present application relates to apparatus and methods for self-biasing, multimode differential signaling circuit and, more particularly, providing self-biasing control of the differential signaling circuit with biasing circuits operable in multiple modes of operation in low voltage applications.

BACKGROUND

Differential signaling has become increasingly used for providing high-speed analog circuit techniques in order to effect higher bandwidth for digital data transfers and signaling that are also simple and cost effective. The use of differential signaling has proven beneficial in a number of different applications, including transmitting video digital signals to display devices, such as display monitors or screens.

Among the various differential signaling technologies utilized today in differential signaling, two examples include low voltage differential signaling (LVDS) and transition minimized differential signaling (TMDS). Each of these types of differential signaling technologies has inherent advantages. In order to be able to utilize the advantages inherent with each type of signaling technology, it is known to utilize differential signaling circuits operable in two or more modes of operation, each mode employing a different signaling technology. For example, it is known to utilize multimode differential output drivers operable to switch between LVDS and TMDS technologies. Attendant with each of these technologies, however, the output configurations and voltage levels are different. For example, LVDS may utilize a low voltage such as 1.8 volts, whereas TMDS typically utilizes a higher voltage supply such as 3.3 volts. As an example of a multimode output driver, FIG. 1 illustrates a dual mode differential signaling circuit 100 that is operable to provide either LVDS or TMDS signaling. The circuit 100 includes a pair of current steering transistors 102, 104, which are labeled MN1 and MN2. These transistors respectively receive input signals 106, 108 labeled as ID+ and ID−. In one embodiment, the input signals 106 and 108 are received from any suitable logic (not shown) such as core logic (e.g., a CPU or other processing entity associated with a system to which circuit 100 is a part) and together represent data for transmission. As used herein, logic may be, for example, any suitable combination of hardware and/or hardware and software. For example, logic may include any combination of processors, memory, engines, programmable and non-programmable hardware, integrated circuits, application specific integrated circuits (ASICs), digital signaling processors (DSPs), and discrete circuit elements. The combination of the current steering transistors 102, 104 and a current source 110 effects differential signaling from a pair of outputs 112, 114 respectively connected to the current steering transistors 102 and 104.

When the circuit 100 is operated in an LVDS mode, under the control of some mode control 116, for example, a pair of current sources 118, 120 are coupled to the outputs 112 and 114, respectively, via a pair of switches 122, 124. This configuration is otherwise known as a current mode configuration where the constant current sources 118 and 120 drive current at the outputs 112 and 114. It is also noted that when operating in an LVDS mode, a termination resistor 130 is connected across the output contacts 112 and 114, the termination resistor 130 typically being connected across the lines connected to outputs 112 and 114 at a receiver (not shown). For purposes of illustration only, switches 126 and 128 indicate that the termination resistor 130 is only temporal, only being connected during LVDS modes.

For TMDS mode operation, an open drain configuration is effected to perform this type of signaling. Accordingly, a control, such as mode control 116, is utilized to open the switches 122 and 124, thereby ensuring that an internal pull-up structure to internal voltage source VDD is not coupled to the outputs 112 and 114. Moreover, a higher voltage, which is typical for TMDS, is connected to the outputs 112 and 114. This is illustrated in FIG. 1 as an additional voltage source 132, which may be 3.3 volts for this example. The voltage source 132 is connected to the outputs 112 and 114 via pull-up resistors 134 and 136 at a receiver (not shown). Also, for illustration purposes only, the voltage source 132 and pull-up resistors 134 and 136 are connected to the outputs 112 and 114 by switches 138 and 140 to indicate that the connections are temporal only during TMDS mode.

If the circuit of FIG. 1 is implemented within an integrated circuit, such as in ASICs including telecommunication chips, field programmable gate arrays, and other devices having differential output drivers, it is desirable in some applications to employ a lower voltage for the internal voltage source VDD. For example, a voltage level of 1.8 volts is typical for some integrated circuits. With a dual mode differential output driver such as the circuit of FIG. 1, when particular types of switching devices are utilized for switches 122 and 124 with a low voltage supply for VDD, certain modes of operation become problematic. For example, if NMOS transistors are utilized for switches 122 and 124 with a 1.8 voltage supply for VDD, operation of the circuit 100 in LVDS mode becomes inoperable. Specifically, the switches 122 and 124 turn off, thus the current sources 118 and 120, which are required for operation in LVDS mode, are not connected to the outputs 112 and 114. This is caused by a low voltage occurring between the gate and source of the NMOS devices resulting in no current flow from the current sources 118 and 120 to the outputs 112 and 114 and, thus, the termination resistor 130. Accordingly, no output voltage swing results and proper signaling does not occur.

In another example, if a PMOS transistor is utilized for switches 122 and 124 with a low voltage supply VDD of 1.8 volts during a TMDS mode, the circuit becomes inoperable for this type of signaling. Specifically, a reverse leakage current occurs from the external higher voltage source 132 (i.e., 3.3 volts) to the internal VDD supply of 1.8 volts because the switches 122 and 124, which are PMOS devices in this example, turn on due to a forward biasing of the diodes of the PMOS devices. Moreover, a current path arises from the drains of these PMOS devices to their substrate or bulk, which results in high leakage current and undesirable heating of the chip in which the circuit is located.

Accordingly, in conventional circuits such as the circuit of FIG. 1, a solution to the above problems has been to utilize an additional high voltage supply within the chip in order to implement TMDS (with a PMOS device as the switch), resulting in design restrictions and/or higher chip cost because of an additional voltage supply. An alternative conventional solution also has included using an on-chip voltage regulator to generate the necessary high voltage from the low voltage source. This generated high voltage then is used to bias switches 122 and 124, when implemented with PMOS devices, during the TMDS mode of circuit 100. Again, however, this solution utilizes more chip area within the integrated circuit and increases power consumption due to the use of an on-chip voltage regulator.

DETAILED DESCRIPTION OF THE PRESENT EXAMPLES

Figure 1:
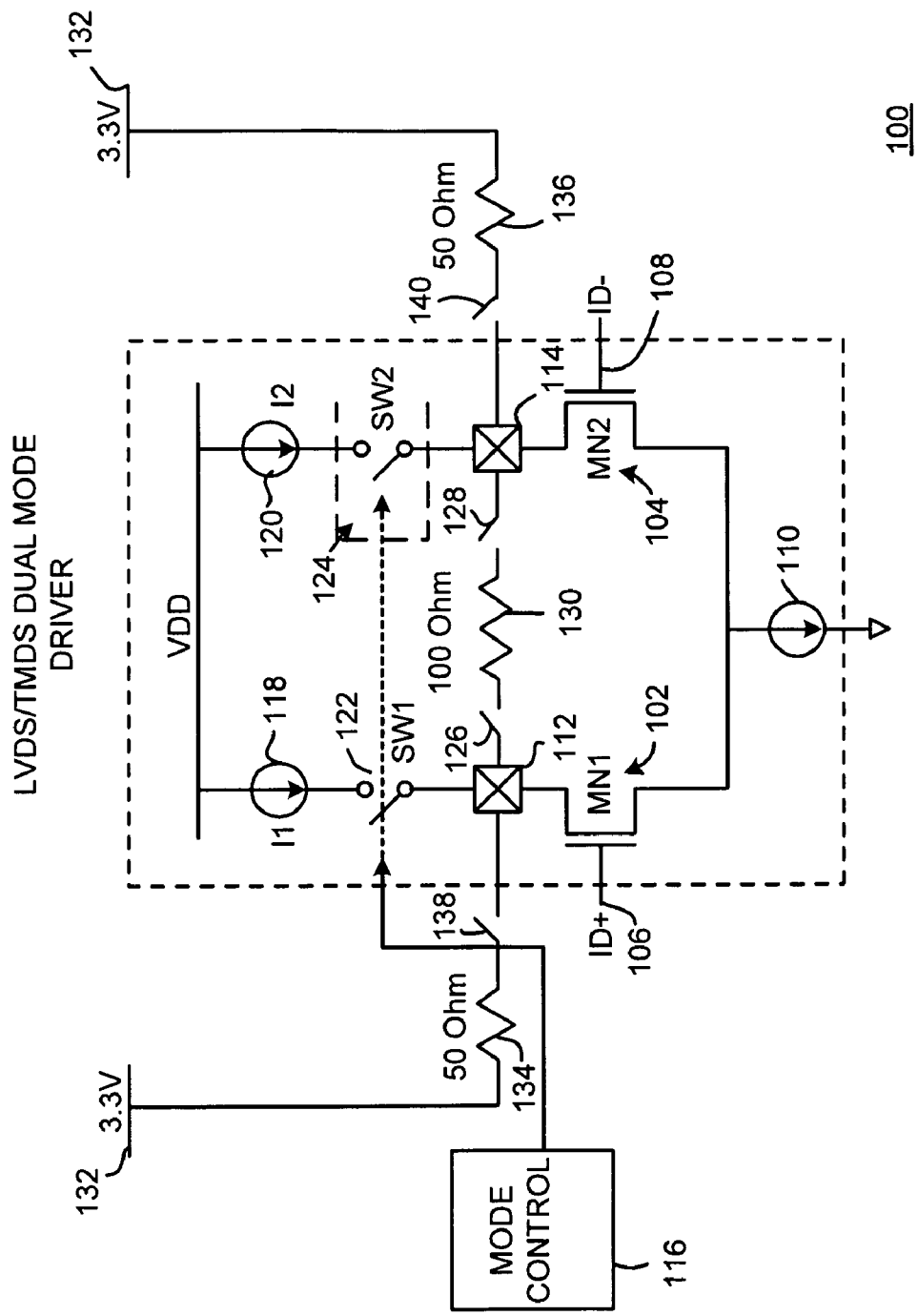
FIG. 1 illustrates an example of a conventional dual mode differential signaling circuit.

The present disclosure relates to a differential signaling circuit including differential signaling circuitry having at least one output and one input. A plurality of switches is included and configured to selectively couple a supply voltage to the output dependent on a mode of operation of the differential signaling circuitry. The circuit also includes a switch control biasing circuit operatively coupled to a switch of the plurality of switches and to the output of the differential signaling circuitry. The switch control biasing circuit is configured to provide a switch control biasing voltage to control a state of the switch based on a voltage level of the at least one output. Further, a bulk biasing circuit is included and operatively coupled to the switch. The bulk biasing circuit is configured to selectively provide a bulk biasing voltage to the switch based on the voltage level of the at least one output.

By including a switch control biasing circuit and a bulk biasing circuit, whose output biasing voltages are dependent on the voltage of the output of a differential signaling circuit, a low voltage source for the internal supply voltage VDD may be utilized with a differential signaling circuit without the need for an additional higher voltage supply or a voltage converter. Furthermore, the disclosed apparatus and methods achieve an output driver for differential signaling that is operable in different modes (e.g., LVDS and TMDS) with a single low power supply where proper switching is effected between current mode configurations and open drain configurations, for example, while a leakage current path is prevented when the voltage level of the output of the differential signaling circuit is higher than the internal voltage supply.

Additionally, a method for controlling a multimode differential signaling circuit with a switch that selectively couples a supply voltage to an output of the differential signaling circuit is disclosed. The method includes providing a switching biasing voltage to the switch, a level of the switching biasing voltage being dependent on a voltage level the output of the multimode differential signaling circuit. Additionally, a bulk biasing voltage is supplied to a bulk of the switch, a level of the bulk biasing voltage being dependent on the value of the output of the multimode differential signaling circuit.

Furthermore, the present application discloses a multimode differential signaling circuit that includes a switching circuit. The switching circuit includes a first terminal operatively coupled to a voltage supply and a second terminal coupled to an output terminal of the differential signaling circuit. Additionally, the switching circuit includes a control terminal operatively coupled to a control biasing voltage to selectively control electrical conduction from the first terminal to the second terminal, wherein the control biasing voltage is generated by a switch control biasing circuit configured to set the control biasing voltage dependent on the voltage level of the second terminal.

The present disclosure further relates to a digital data transmitting device having differential signaling circuitry, a pair of transistor-implemented current sources and a current source controller. The current source controller generates a current source control signal based on a detected mode of operation of the differential signaling circuitry, e.g., by detecting voltage levels on the differential signaling circuitry's differential output terminals. In response to the current source signal, the pair of transistor-implemented current sources selectively generates source currents to adjust the output voltage levels at the differential output terminals.

In one embodiment, the digital data transmitting device further includes a current source bulk biasing circuit operative to generate a current source bulk biasing signal based on the detected mode of operation of the differential signaling circuitry. When the differential signaling circuitry is in a first mode of operation (e.g., LVDS), the current source bulk biasing control signal acts to enable the pair of transistor-implemented current sources to generate the source currents. When the differential signaling circuitry is in a second mode of operation (e.g., TMDS), the current source bulk biasing control signal acts to retard current leakage across the pair of transistor-implemented current sources.

The present disclosure further relates to a method for transmitting digital data using differential signaling circuitry having differential output terminals and by using a pair of transistor-implemented current sources to selectively generate source currents to adjust the output voltage levels at the differential output terminal in response to a detected mode of operation. The method may also include, among other things, enabling the pair of transistor-implemented current sources to generate the source currents during a first mode of operation and retarding current leakage across the pair of transistor-implemented current sources when the differential signaling circuitry is operating in a second mode of operation.

The present disclosure further relates to a digital data receiving device including a receiver capable of receiving digital data output signals from a digital data transmitting device as described herein where the digital data output signals correspond to the voltage levels on the digital data transmitting device's differential output terminals.

In the following detailed description, numerous specific details are set forth in order to provide a thorough understanding of the present disclosure. It will be apparent to one of ordinary skill in the art, however, that these specific details may not be used to practice the present disclosure. In other instances, our well-known structures, interfaces and processes have not been shown or described in detail in order not to unnecessarily obscure the present invention.

Figure 2:
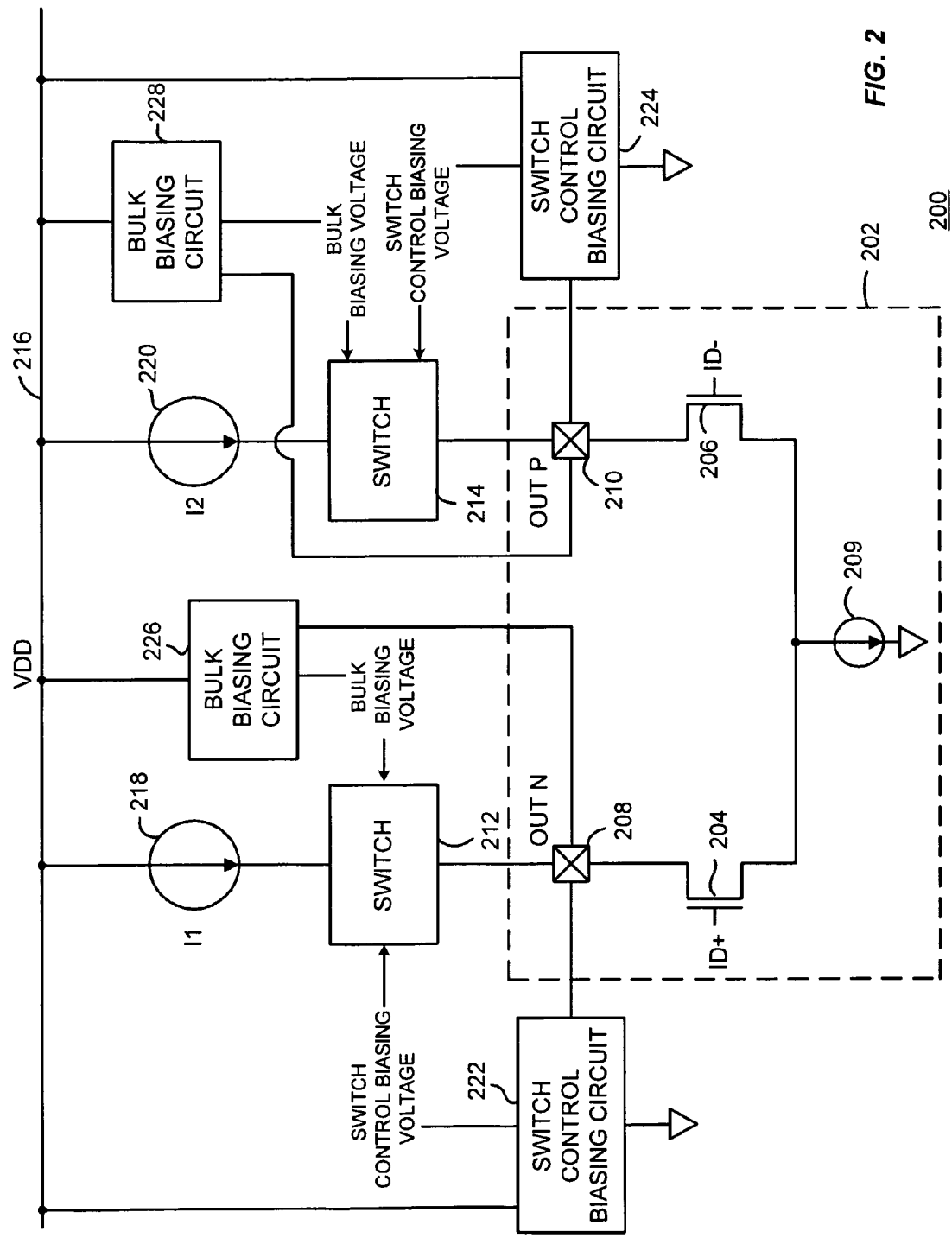
FIG. 2 illustrates an example of a multimode differential signaling circuit in accordance with the present disclosure.

FIG. 2 illustrates an example of a differential signaling circuit according to the present disclosure. The circuit 200 includes differential signaling circuitry 202 including current steering transistors 204 and 206 respectively connected to input signals ID+ and ID−. The transistors 204 and 206 are coupled to a current steering source 209 and also to a pair of output terminals 208 and 210 labeled as OUTN and OUTP. The circuit 200 also includes a pair of switches 212 and 214 having terminals connected to the outputs 208 and 210 of the differential signaling circuitry 202. The switches 212 and 214 selectively couple a supply voltage 216, labeled as VDD, to the outputs 208 and 210 via respective current sources 218 and 220. It is noted that these switches 212 and 214 correspond to switches 122 and 124 illustrated in the conventional circuit of FIG. 1.

Associated with each of the switches 212 and 214 is a respective switch control biasing circuit 222, 224. These circuits 222, 224 are coupled to the switches 212 and 214, respectively, in order to provide a switch control biasing voltage. This voltage effects control of the state of the switches 212, 214; that is, the switch control biasing voltage turns the switches 212, 214 on or off. The switch control biasing circuits 222, 224 are also operatively coupled to the output terminals 208 and 210 and set the switch control biasing voltage based on the voltage level present at the outputs 208 or 210. In particular, during a LVDS mode of the circuit, the switch control biasing circuits 222 and 224 provide a voltage of a particular level to turn on the switches 212 and 214, respectively, in order to connect the voltage supply 216 and the current sources 218 and 220 to the outputs 208 and 210. Conversely, when the circuit 200 operates in a TMDS mode, the levels of the outputs 208 and 210 are changed due to connection of an external high voltage supply (not shown, but equivalent to the supply voltage 132 of FIG. 1). The switch control biasing circuits 222 and 224 are configured to accordingly provide a switch control biasing voltage that ensures the switches 212 and 214 are turned off, thereby effecting TMDS operation.

The signaling circuit 200 also includes at least two bulk biasing circuits 226 and 228 associated with switches 212 and 214, respectively. In particular, the bulk biasing circuits 226 and 228 are operatively coupled to the switches 212, 214 and selectively provide a bulk biasing voltage to the switches 212, 214 based on the voltage level of the outputs 208, 210. In particular, the switches 212 and 214 are implemented using MOS transistors having a substrate or bulk and the bulk biasing circuits 226 and 228 are operative to provide a bulk biasing voltage to the bulks of switches 212 and 214 at a level commensurate with the output voltages on outputs 208 and 210 to prevent leakage current. In TMDS operation, for example, because the switch control biasing circuits 222, 224 provide control to turn off the switches 212, 214, a bulk biasing voltage ensures that leakage current does not occur from the output terminals 208 and 210 through the switches 212 and 214 to the lower internal voltage source 216.

In light of the above description, the circuit of FIG. 2 affords a differential signaling output driver that is universal for multiple modes of operation, such as LVDS and TMDS. By providing circuitry, such as switch control biasing circuit 222 and bulk biasing circuit 226, that derive a voltage level automatically tracking the output level at outputs 208 and 210, this universal functionality is effected. Furthermore, the circuit of FIG. 2 implements a universal differential output driver using a single, low power supply where the switches 212 and 214 may be turned off or on, dependent on the mode of operation, while also preventing leakage current when the voltage level of the outputs 208 and 210 are higher than the internal voltage supply 216.

Figure 3:
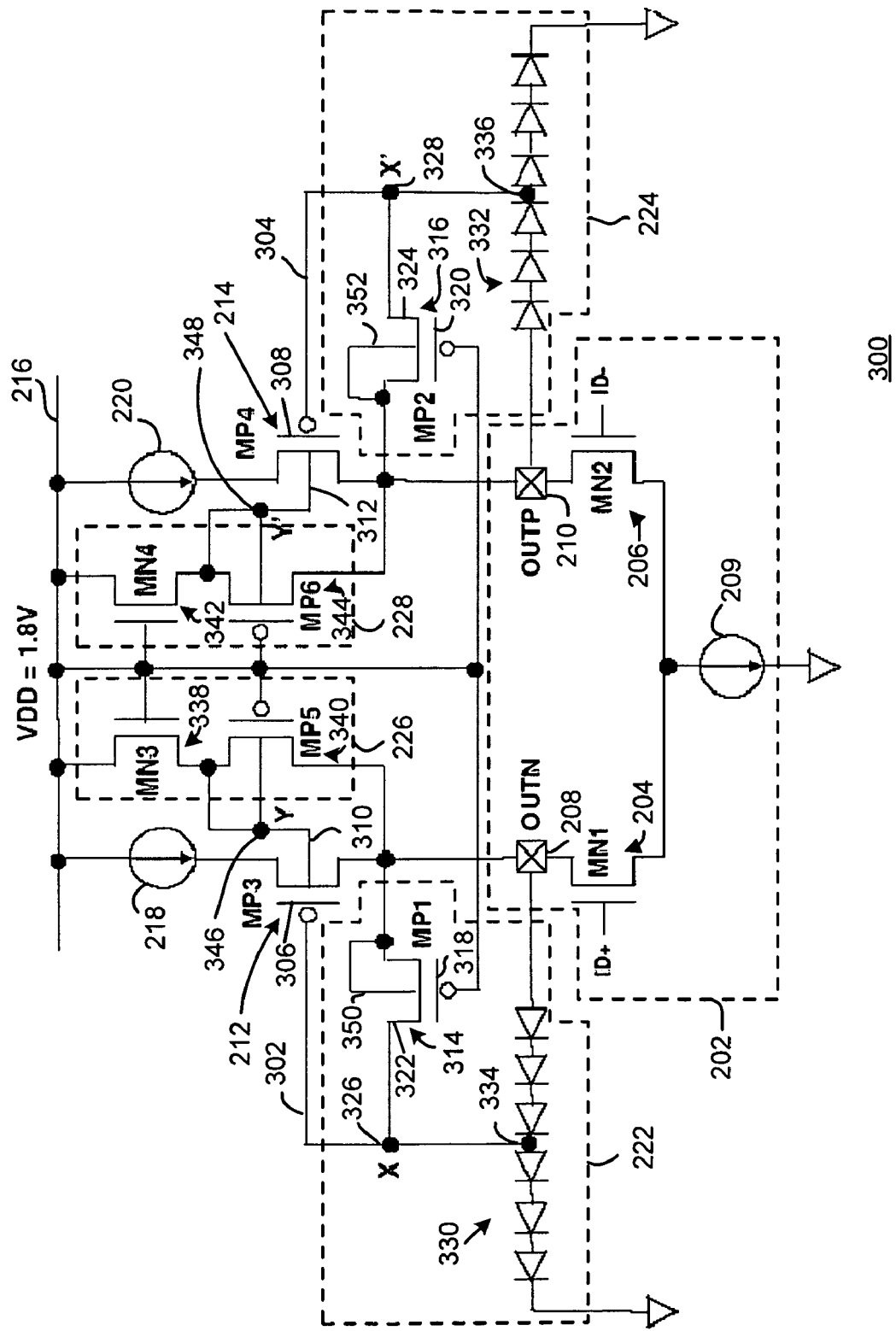
FIG. 3 illustrates an exemplary implementation of the circuit illustrated in FIG. 2.

FIG. 3 illustrates a circuit diagram of a specific implementation of the circuit of FIG. 2. It is noted that the same reference numbers are used in FIG. 3 to denote equivalent elements in this circuit to those in FIG. 2. As illustrated, the switches 212 and 214 are implemented as PMOS switches and are also labeled MP3 and MP4. Switching of these switches, 212, 214 is controlled by the switch control biasing circuits 222 and 224, respectively. In particular, the circuits 222 and 224 respectively output a control biasing voltage 302 and 304 to gates 306 and 308 of switches 212 and 214. Additionally, each of the switches 212 and 214 include a respective substrate or bulk terminal 310 and 312 connected to the bulk biasing circuits 226 and 228, respectively. Each of the bulk biasing circuits 226, 228 delivers the bulk biasing voltage to the bulk terminals of switches 212 and 214 in order to prevent leakage current path when the outputs 208 and 210 are greater than the internal voltage 216, such as in TMDS mode.

Within each of the switch control biasing circuits 222 and 224 is a respective switch 314 and 316. In the example of FIG. 3, each of these switches 314 and 316 is labeled MP1 and MP2 and are illustrated as PMOS type switches. The gates 318, 320 of these switches 314 and 316 are connected to the internal voltage source 216. Another terminal of both switches 314 and 316 are connected to respective output terminals 208 and 210. Another terminal 322, 324 of switches 314 and 316 is connected to a node 326, 328 (labeled X and X' for circuits 222 and 224, respectively). These nodes 326, 328 are connected to the gate terminals 306 and 308 of switches 212 and 214, respectively. Additionally, these nodes 326, 328 are respectively connected to voltage divides 330 and 332 discussed below.

As illustrated, each of the switch control biasing circuits 222 and 224 include a respective voltage divider 330 and 332 used to produce a voltage at nodes 326 and 328 that is proportional, but lower than the outputs 208 and 210. FIG. 3 illustrates that the voltage dividers 330 and 332 are constructed with a chain of diodes connected between the outputs 208 and 210 and a common voltage, such as ground. As will be recognized by those skilled in the art, however, any number of various types of devices may be utilized for performing voltage division. Additionally, the voltage dividers 330, 332 include taps 334, 336 interposed in the diode chain to derive a particular desired voltage level for the nodes 326 and 328.

In operation, the voltage divider circuit 330 works in conjunction with the switch 314, 316 to control the operation of the switches 314, 316 dependent on the voltage level of the output terminals 208 and 210. For example, if the voltages of the output terminals 208, 210 are lower than the internal voltage VDD (216), the voltages at taps 334, 336 are proportional, yet lower than the voltage at output terminals 208, 210. Accordingly, because the voltages at output terminals 208, 210 are lower than the internal voltage supply 216, the switches 314 and 316 are turned off, thereby isolating the nodes 326, 328 from the outputs 208 and 210. Moreover, because the voltage divider circuits 330 and 332 cause a voltage drop between the output terminals 208, 210 and the taps 334, 336 the reduced voltage present at nodes 326, 328 reduce the control signal voltage levels 302 and 304 such that PMOS switches 212 and 214 turn on. When the switches 212, 214 are turned on, the current supplies 218, 220 are then connected to the output terminals 208, 210 for a current node configuration, such as in LVDS operation.

In an alternative example, if the voltage of the outputs 208, 210 are much higher than the internal voltage 216, such as during a TMDS mode where 3.3 volt sources are connected by pull up resistors to the output terminals 208, 210 (see FIG. 1 as an example). In this case, because the voltages of the outputs 208, 210 are much higher than the internal voltage 216, the switches 314 and 316 will turn on. Accordingly, the voltages at terminals 326 and 328 become similar to the output voltages 208, 210 as the switches 314, 316 are typically selected to have a very small turn-on resistance and, thus, the voltages will be essentially the same. In turn, because the voltages 326 and 328 are high like the output terminals, 208, 210, the switches 212 and 214 are turned off, thereby ensuring that an open-drain configuration is effected for switches 212 and 214.

Based on the foregoing discussion, the switch control biasing circuits 222, 224 are operable to provide an appropriate switch control biasing voltage, 302, 304 for various modes of operation, namely LVDS and TMDS modes. In LVDS mode, the output terminals 208, 210 may have a voltage range between 0.8 volts and 1.7 volts (and more commonly has a voltage range between 0.9V and 1.5V), which is lower than the typical VDD voltage of 1.8 volts. Accordingly, as explained above, the switches 314 and 316 are turned off at these voltage levels and switches 212 and 214 are turned on, in turn. Alternatively, in TMDS mode the output voltage levels of outputs 208 and 210 typically have voltages between 2.7 volts and 3.3 volts, which are much higher than the typical internal source voltage VDD of 1.8 volts. Accordingly, as explained above, the switches 314 and 316 are turned on and switches 212 and 214 are, in turn, turned off.

Circuit 300 of FIG. 3 also includes, as mentioned previously, at least one bulk biasing circuit. As shown, the circuit in FIG. 3 includes two bulk biasing circuits 228 and 226 that serve to bias the substrate or bulks of switches 212 and 214, respectively. Each of the bulk biasing circuits 226, 228 include a series connected pair of switches, which are labeled MN3 and MP5 for circuit 226 and MN4 and MP6 for circuit 228. These switches are respectively labeled also with reference numbers 338, 340, 342, and 344. As illustrated, each of the switches 338, 340, 342 and 344 have terminals connected to the internal voltage source 216. Additionally, each series connected pair includes an NMOS transistor (i.e., 338 and 342) and a PMOS transistor (i.e., 340 and 344). Junction nodes 346 and 348 of these respective pairs of transistors are respectively connected to the bulk terminals 310 and 312 of switches 212 and 214 for the purpose of providing a bulk biasing voltage to prevent leakage currents, particularly when the circuit 300 is in TMDS mode.

In operation, the switches 338 and 342 (MN3 and MN4) are turned on when the circuit 300 is operated in LVDS mode and are turned off when the circuit 300 is operated in TMDS mode. During LVDS mode, in particular, the switches 340 and 344 are turned off. Assuming an LVDS operation where the common level output on outputs 208 and 210 is approximately 1.2 volts, the switches 340 and 344 are all turned off, switches 338 and 342 are diode connected to charge node Y and Y' up to VDD; therefore, the voltage present at nodes 346 and 348 (Y and Y') would be approximately 1.6 to 1.7 volts assuming a VDD equal to 1.8 volts. In TMDS mode, however, the switches 340 and 344 are turned on due to a voltage present at the outputs 208 and 210 being greater than the internal voltage supply voltage 216 and switches 338 and 342 are turned off because the gate and source terminals are both at VDD 216. Thus, assuming a typical TMDS output voltage of 3.3 volts of input or a common voltage of approximately 3 volts, the voltage level present at nodes 346 and 348 will be approximately equal to the voltage at the output terminals 208 and 210. In other words, the voltage level present at the output terminals 208 and 210 is effectively coupled to the bulk terminals of switches 212 and 214. Accordingly, a sufficient voltage is provided to the bulk terminals 310 and 312 of switches 212 and 214 to prevent leakage current through the substrate or bulk of these switches flowing from the output terminals 208 and 210 to the internal voltage 216.

Of further note, the switches 314 and 316 also include a bulk terminal connection 350, 352 to the source terminals of these switches, in particular, in order to prevent leakage current from output terminals 208 and 210 to the internal voltage 216 during the TMDS mode. Moreover, in the example of FIG. 3, switches 340 and 344 also have a bulk terminal connected to the nodes 346 and 348, respectively, in order to ensure no leakage current occurs in these switching devices.

Figure 4:
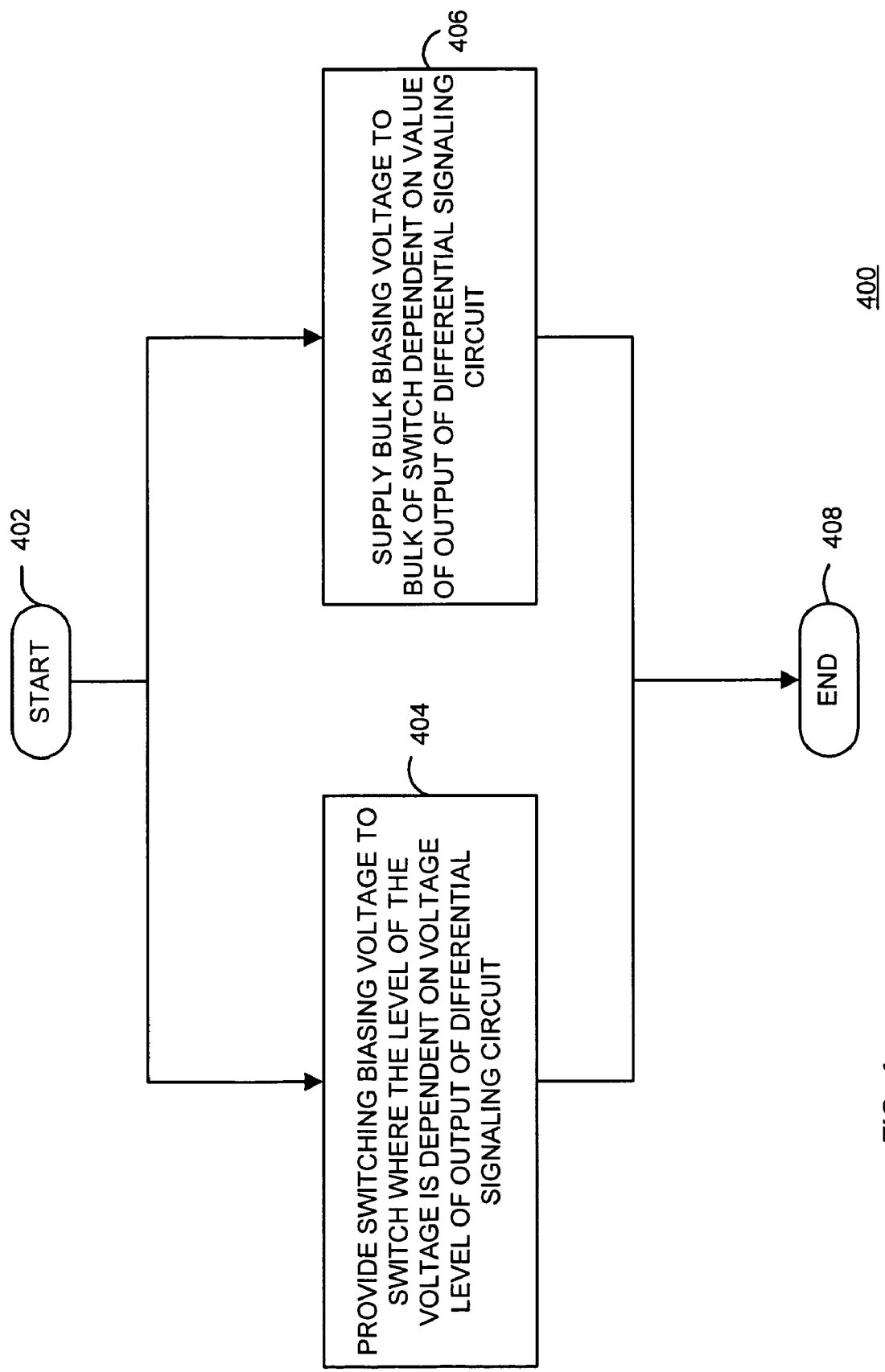
FIG. 4 illustrates an exemplary flow diagram of a method in accordance with the present disclosure.

FIG. 4 illustrates an example of a method for controlling the multi mode differential signaling circuit, such as the circuits of FIGS. 1 and 2, with a control bias switch that is dependent of the voltage level of the output of the differential signaling circuit. As illustrated, a flow diagram 400 begins at a start block 402. After initialization, flow proceeds to block 404 where a bias voltage is provided to a switch in a multimode differential output circuit. This is performed, for example, by the switch control biasing circuits 222, 224 when providing the switch control biasing voltage to switches 212 and 214. Additionally, at block 404, the level of the voltage is set dependent on the voltage level of the output of the differential signaling circuit. This is, as described previously, based on circuitry that, for example, provides a switch control voltage of sufficient level to turn off the switches 212 or 214 during a TMDS mode and deliver a voltage of sufficient level to ensure that the switches 212 and 214 turn on during an LVDS mode.

Simultaneous with block 404, flow also proceeds from block 402 to block 406 where a bulk biasing voltage is supplied to a bulk of the switches dependent on a value of the output of the differential signaling circuit. Again, as described previously, the bulk biasing circuits 226 and 228 provide an example of this functionality where, dependent on the voltage at terminals 208 or 210, the switches 340 or 344 are turned on or off in order to selectively apply a bulk biasing voltage sufficient to ensure no leakage in switches in 212 and 214. In particular, during TMDS mode the switches 340 and 344 are turned on in order to ensure that switches 212 and 214, which are turned off during this mode, are bias to prevent leakage current through the bulk of these devices. Flow then proceeds from both blocks 404 and 406 to block 408 where the method ends. It is noted that, although the method illustrated in FIG. 4 shows simultaneous sequential blocks 404 and 406, the processes indicated therein may occur simultaneously, as shown, or may also occur at slightly different times.

Based on the foregoing, one of ordinary skill in the art will appreciated that by including a switch control biasing circuit and a bulk biasing circuit whose output voltages are automatically dependent on the voltage of the output of a differential signaling circuit, proper operation of the multimode differential signaling circuit using only a low voltage source for VDD may be realized without the need for an additional higher voltage supply. Furthermore, the above-disclosed apparatus and methods achieve a differential signaling circuit that is operable in different modes (e.g., LVDS and TMDS) with a single low power supply where proper switching is effected between current mode configurations and open drain configurations while leakage current is prevented in the switch, which selectively connects the internal voltage to the output, when the voltage level of the output of the differential signaling circuit is higher than the internal voltage supply.

One of ordinary skill in the art will further appreciate that although specific PMOS and NMOS switching devices are disclosed in the above examples, any suitable switching devices may be utilized to realize the disclosed apparatus and methods. Moreover, it is also conceivable that other suitable circuit configurations may be used to achieve the functionalities described above.

Furthermore, the differential signaling circuits of FIGS. 2 and 3 may also be implemented within an integrated circuit (not shown), such as within ASICs including graphics processing chips, telecommunication chips, field programmable gate arrays, and any other circuits or devices integrating differential output drivers. As discussed previously, it is desirable in some integrated circuit applications to employ a lower voltage for the internal voltage source VDD (e.g., 1.8 volts). Thus, the disclosed apparatus and methods, which implement a multimode differential signaling circuit that correctly operates at lower voltage across multiple modes, are well suited for implementation in integrated circuits.

Figure 5:
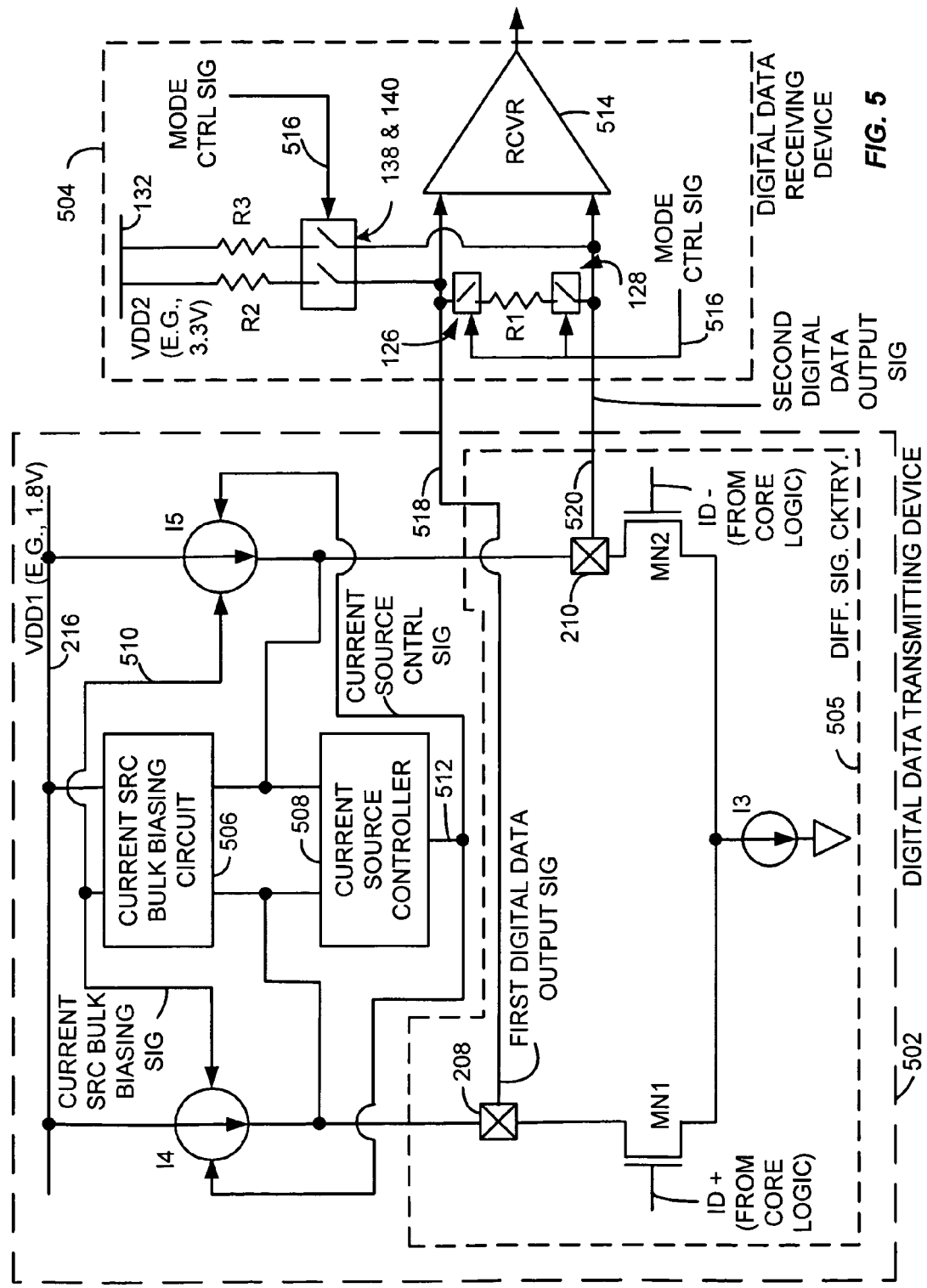
FIG. 5 is a block diagram illustrating an example of a digital data transmitting device and a digital data receiving device in accordance with one embodiment of the present disclosure.

FIG. 5 is a block diagram illustrating an example of a digital data transmitting device 502 and digital data receiving device 504 in accordance to the one embodiment to the present disclosure. As contemplated, digital data transmitting device 502 and digital data receiving device 504 are located on separate integrated circuits. However, it is contemplated that each of the digital data transmitting device 502 and the digital data receiving device 504 may be located on the same integrated circuit or on the same integrated circuit package. In one embodiment, digital data transmitting device 502 includes differential signaling circuitry 505, current source bulk biasing circuit 506, current source controller 508 and a pair of transistor-implemented current sources I4 and I5.

The differential signaling circuitry 505 may be identical to or similar to differential signaling circuitry 202 and includes a first output terminal 208, a second output terminal 210, a first NMOS transistor MN1, a second NMOS transistor MN2 and a tail current source I3 (also referred to herein as a current steering source). As used herein, the first and second output terminals 208, 210 constitute "differential output terminals". As illustrated, the first output terminal 208 is coupled to a first terminal of the first NMOS transistor MN1 and the second terminal of the first NMOS transistor MN1 is coupled to the tail current source I3. The gate of the first NMOS transistor MN1 is coupled to receive a first input signal ID+, where the first input signal ID+ is generated from any suitable logic (e.g., core logic). In a similar manner, the first terminal of the second NMOS transistor MN2 is coupled to the second output terminal 210, the second terminal of the second NMOS transistor MN2 is coupled to the tail current source I3, and the gate of the second NMOS transistor MN2 is coupled to receive a second input signal ID−, where the second input signal ID− is generated from any suitable logic (e.g., core logic). As is contemplated, when taken together, first and second input signals ID+ and ID− represent data for transmission to any suitable receiving device or circuit (e.g., digital data receiving device 504) irregardless of its location. The tail current source I3 is coupled between the second terminals of NMOS transistors MN1 and MN2 and ground. While differential signaling circuitry 505 is shown as including NMOS transistors and a tail current source, it is contemplated that differential signaling circuitry 505 may be implemented using any suitable circuit or circuits including, for example, any combination of transistors irregardless of type, and circuit components or elements irregardless of their passive or active nature (collectively "circuit elements").

The pair of transistor-implemented current sources I4 and I5 are coupled between a respective output terminal 208, 210 and a first voltage source VDD1 216. In one embodiment, first voltage source VDD1 216 is 1.8 V and corresponds to a digital data transmitting device voltage source. In another embodiment, first voltage source VDD1 216 is any suitable voltage source or supply less than the second voltage source VDD2 132 as discussed below. In one embodiment, current sources I1 and I2 of FIGS. 1 and 2 are the pair of transistor-implemented current sources I4 and I5. Unlike the constant current sources 218 and 220 of FIGS. 2 and 3, the pair of transistor-implemented current sources I4 and I5 are not coupled to the respective output terminals 208 and 210 through a switch such as switch 122 and 124 or switch 212 and 214. This provides greater "headroom" at the output terminals with respect to voltage, i.e., the voltage levels of the first and second digital data output signals 518 and 520 have a greater dynamic output voltage range. This, in addition to the inclusion of current source bulk biasing circuit 506 and current source controller 508 (as discussed further below), allows the "active" pair of transistor-implemented current sources I4 and I5 to be enabled and disabled in a way that is transparent to the signal path.

The current source bulk biasing circuit 506 is coupled to each of the first and second output terminals 208, 210 and to the first voltages source VDD1 216, and generates the current source bulk biasing signal 510 based on a detected mode of operation. In one embodiment, the mode of operation is detected based on at least on the voltage levels at each of the first and second output terminals 208 and 210. Each of the transistor-implemented current sources I4 and I5 receive the current source bulk biasing signal 510. The current source bulk biasing signal 510 is any suitable signal such as but not limited to a voltage or any information that, upon receipt by the pair of transistor-implemented current sources I4 and I5, acts to retard current leakage across the pair of transistor-implemented current sources I4 and I5 when the differential signaling circuitry 505 is in the second mode of operation (e.g., TMDS mode). During the first mode of operation (e.g., LVDS), the current source bulk biasing signal 510 represents any suitable signal capable of enabling the transistor-implemented current sources I4 and I5 to generate current.

The current source controller 508 is coupled to each of the first and second output terminals 208, 210 and generates the current source control signal 512 based on a detected mode of operation. In one embodiment, the mode of operation is detected based on the voltage levels at each of the first and second output terminals 208 and 210. As further explained below, during a first mode of operation (e.g., LVDS mode), the transistor-implemented current sources I4 and I5 are selectively turned on to selectively provide source current to each of the first and second output terminals 208 and 210. In other words, the pair of transistor-implemented current sources I4 and I5 selectively generate source currents to adjust the output voltage levels at the differential output terminals by selectively coupling the differential output terminals to the first voltage source VDD1 216. Whereas in the second mode of operation (e.g., TMDS mode), the pair of transistor-implemented current sources I4 and I5 is selectively turned off such that the first voltage supply source VDD1 216 is no longer coupled to the first and second output terminals 208 and 210. No source current is generated during this mode.

It is contemplated that each of the current source bulk biasing circuit 506 and the current source controller 508 is implemented using any suitable circuit elements. Similarly, the pair of transistor-implemented current sources I4 and I5 are implemented using at least one transistor but may also include any other suitable circuit elements. Thus, the current source bulk biasing circuit 506, the current source controller 508 and the pair of transistor-implemented current sources I4 and I5 are not limited to the specific implementations shown in the following figures.

The first and second output terminals 208 and 210 of the digital data transmitting device 502 are coupled to the digital data receiving device 504. In one embodiment, the first and second output terminals 208 and 210 are coupled to the digital data receiving device 504 through any suitable interconnecting media such as, for example, cable or a printed circuit board. The digital data receiving device includes receiver 514 coupled to receive the first digital data output signal 518 and the second digital output signal 520. The receiver 514 is coupled to a second voltage source VDD2 132 through switches 138 and 140 and resistors R2 and R3. In one embodiment, second voltage source VDD2 is 3.3V and corresponds to a digital data receiving voltage source. In another embodiment, the second voltage source VDD2 is any suitable voltage source or supply greater than the first voltage source VDD1 216. A termination resistor R1 is also coupled between the inputs of the receiver 514 by way of switches 126 and 128. In one embodiment the value for resistors R2 and R3 may be set at 50 ohms while the value for termination resistor R1 may be set at 100 ohms. However, it is contemplated that any suitable resistance value may be chosen. It is further contemplated that any other suitable circuit elements configured to function as a resistor may be used to implement each or any of R1-R3.

As described above with reference to FIG. 1, switches 138 and 140 and switches 126 and 128 receive a mode control signal such as mode control signal 516 (which may, in one embodiment, be similar to the output of mode control 116), which indicates when the above-listed switches are to be opened or closed. The mode control signal 516 may be generated by any suitable logic such as, for example core logic. As is contemplated, the switches 138 and 140 are closed when the digital data transmitting device 502 (more specifically, the differential signal circuitry 505) is operating in a second mode of operation (e.g., TMDS mode), and are open during a first mode of operation (e.g., LVDS mode). Conversely, switches 126 and 128 are closed during a first mode of operation (e.g., LVDS mode), and opened during a second mode of operation (e.g., TMDS mode). As recognized, when the digital data transmitting device 502 is operating in the first or second mode of operation, the digital data receiving device 504 is operating in the same mode of operation. The output of receiver 514 may be used to generate a display on a monitor (e.g., when the transmitted data represents video data), may be stored in any suitable memory, or may be used for additional processing.

As is contemplated, FIG. 5 provides for a fully-functional output driver implemented in or as part or whole of the digital data transmitting device 502 to safely operate as an open-drain output driver by effectively disabling the active pair of transistor-implemented current sources I4 and I5 whenever the voltage level automatically detected at each of the first and second output terminals 208 and 210 rise above the internal voltage source VDD1 216 (e.g., during a second mode of operation/TMDS mode). Conversely, the fully-functional output driver implemented in or as part or whole of the digital data transmitting device 502 to safely operate as an current mode configured output driver by enabling the active pair of transistor -implemented current sources I4 and I5 in a way that is completely transparent to the signal path (i.e., without a switch designed to couple the current sources to the output terminals) during the first mode of operation/LVDS mode. These advantages and others are provided not only in the discussion with respect to FIG. 5, but also further discussed with respect to FIGS. 6-12.

Figure 6:
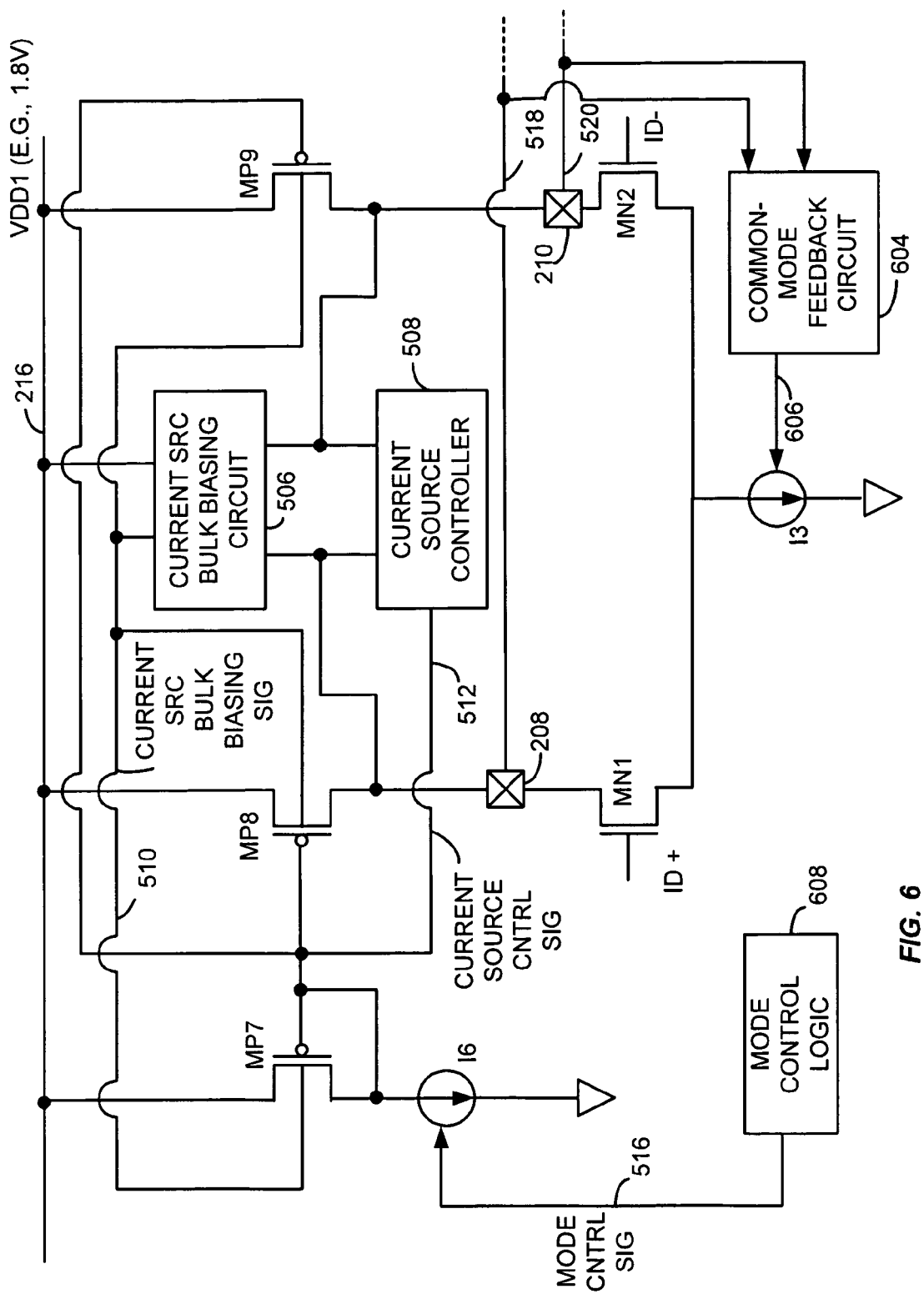
FIG. 6 is a schematic block diagram illustrating a portion of the digital data transmitting device of FIG. 5 having a common-mode feedback circuit and mode control logic, and further illustrating, in more detail, the pair of transistor-implemented current sources using PMOS transistors in accordance with one embodiment of the present disclosure.

FIG. 6 is a schematic block diagram illustrating a portion of the digital data transmitting device 502 of FIG. 5 having a common-mode feedback circuit 604 and mode control logic 608, and further illustrating, in more detail, the pair of transistor-implemented current sources I4 and I5 using PMOS transistors MP7, MP8 and MP9 in accordance with one embodiment of the present disclosure. Each of the PMOS transistors MP7, MP8 and MP9 are configured to form two current mirrors sharing a common biasing transistor MP7. The coupling of MP7 and MP8 forms a first current mirror (i.e., a first transistor-implemented current mirror current source) and, in one embodiment, represents current source I4 of FIG. 5, whereas the coupling of MP7 and MP9 forms a second current mirror (i.e., a second transistor-implemented current mirror current source) and, in one embodiment, represents current source I5 of FIG. 5. Each of the first terminals of PMOS transistors MP7, MP8 and MP9 are coupled to the first voltage source VDD1 216. Each of the gates of the PMOS transistors MP7, MP8 and MP9 are coupled to each other and to receive the current source control signal 512 from the current source controller 508. The second terminal of PMOS transistor MP7 is coupled to the gate of the PMOS transistor MP7 and is also coupled to a reference current source I6. The second terminals of PMOS transistors MP8 and MP9 are coupled to the first and second output terminals 208 and 210 of the differential signaling circuitry 505, respectively. The bulk terminals of each of the PMOS transistors MP7, MP8 and MP9 are coupled to receive the current source bulk biasing signal 510 from the current source bulk biasing circuit 506.

The biasing transistor MP7, when in an on state passes a reference current though two of its terminals, wherein the current is commensurate with the current generated by reference current source I6. Because of the current mirror configuration, the current through PMOS transistor MP8 and PMOS transistor MP9 is capable of mirroring the reference current generated by the reference current source I6 when turned on. Each of the transistors MP8 and MP9 are turned on selectively by the current source control signal 512 (controlling the gate voltage) and a respective input signal ID+ and ID−. The tail current provided by tail current source I3 pulls current through the differential signaling circuitry 505 when MP7-MP9 are turned on (i.e., when the pair of transistor-implemented current sources I4 and I5 are on).

The common mode feedback circuit 604 is coupled to each of the first and second output terminals 208 and 210. Based on the voltage levels detected at each of the first and second digital data output signals 518 and 520, the common mode feedback circuits 604 generates a common-mode feedback signal 606, which is operative to reduce or increase the amount of tail current supplied by the tail current source I3. By reducing or increasing the tail current, the common mode feedback circuit holds constant (or suitably constant) the common mode voltage of the first and second output terminals 208 and 210. In one embodiment, the common mode feedback circuit 604 takes the mean voltage value of the voltage levels detected at the first and second output terminals 208 and 210. In another embodiment, any other suitable algorithm is implemented by common-mode feedback circuit 604 to keep the mean voltage of the first and second output terminals 208 and 210 approximately constant based on the design of the digital data transmitting device 502. If the mean voltage value is greater than a threshold value, the tail current generated by the tail current source I3 is increased. Conversely, if this value is less than the threshold value, the tail current generated by the tail current source I3 is reduced. As is contemplated, common-mode feedback circuit may be implemented using any suitable logic and/or circuit elements.

Mode control logic 608 is operative to generate a mode control signal 516 for receipt by the reference current source I6 of the biasing transistor MP7. The mode control signal 516 enables or disables the generation of the reference current by reference current source I6 based on the mode of operation of the differential signaling circuitry 505. During the first mode of operation (e.g., LVDS mode) the reference current source I6 is enabled to permit the generation of the reference current, while during the second mode of operation (e.g., TMDS mode) the reference current source I6 is disabled and no reference current may be generated. By disabling the reference current source I6 from generating the reference current during the second mode of operation, the reference current cannot compete with the current source control signal 512, which, during the same mode, acts to turn off the pair of transistor-implemented current sources I4 and I5.

Figure 7:
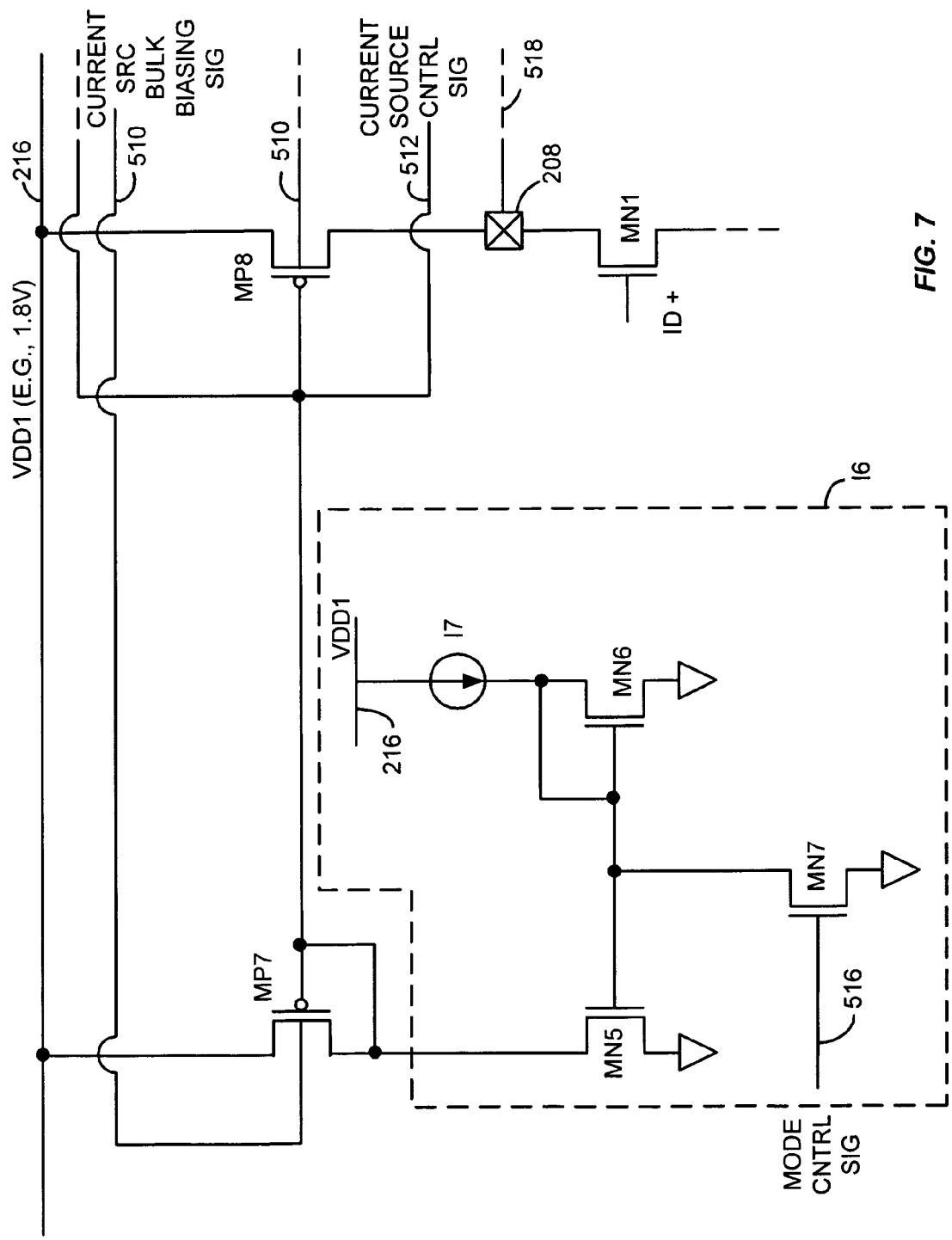
FIG. 7 is a schematic block diagram illustrating an example of the reference current source as part of the biasing transistor of FIG. 6 in accordance with one embodiment of the present disclosure.

Turning to FIG. 7, a schematic block diagram illustrating an example of the reference current source I6 as part of the biasing transistor MP7 of FIG. 6 in accordance with one embodiment of the present disclosure. The reference current source I6 comprises an NMOS current mirror including NMOS transistors MN5 and MN6. The first terminal of NMOS transistor MN5 is coupled to the second terminal of PMOS transistor MP7, the second terminal of NMOS transistor MN5 is coupled to ground and the gate of NMOS transistor MN5 is coupled to the gate of NMOS transistor MN6. The gate of NMOS transistor MN6 is coupled to its first terminal and the first terminal of NMOS transistor MN6 is coupled to a current source I7. Current source I7 is coupled between the first voltage source VDD1 216 and the first terminal of NMOS transistor MN6. The second terminal of NMOS transistor MN6 is coupled to ground. The current through NMOS transistor MN5, when in an on state, is a replicated version of the current through NMOS transistor MN6 (i.e., the current generated by I7). To turn on and off the NMOS transistors MN5 and MN6 (and thereby enable and disable reference current generated by reference current source I6), a switch NMOS transistor MN7 is coupled between the gates of NMOS transistors MN5 and MN6 and ground such that the gate of switch NMOS transistor MN7 receives the mode control signal 516. As contemplated, when the value of the mode control signal 516 is high (e.g., a logic 1), the NMOS current mirror is turned on and the reference current generated by reference current source I6 is enabled. Conversely, when the value of the mode control signal 516 is low (e.g., a logic 0), the NMOS current mirror is turned off and the reference current generated by reference current source I6 is disabled.

Figure 8:
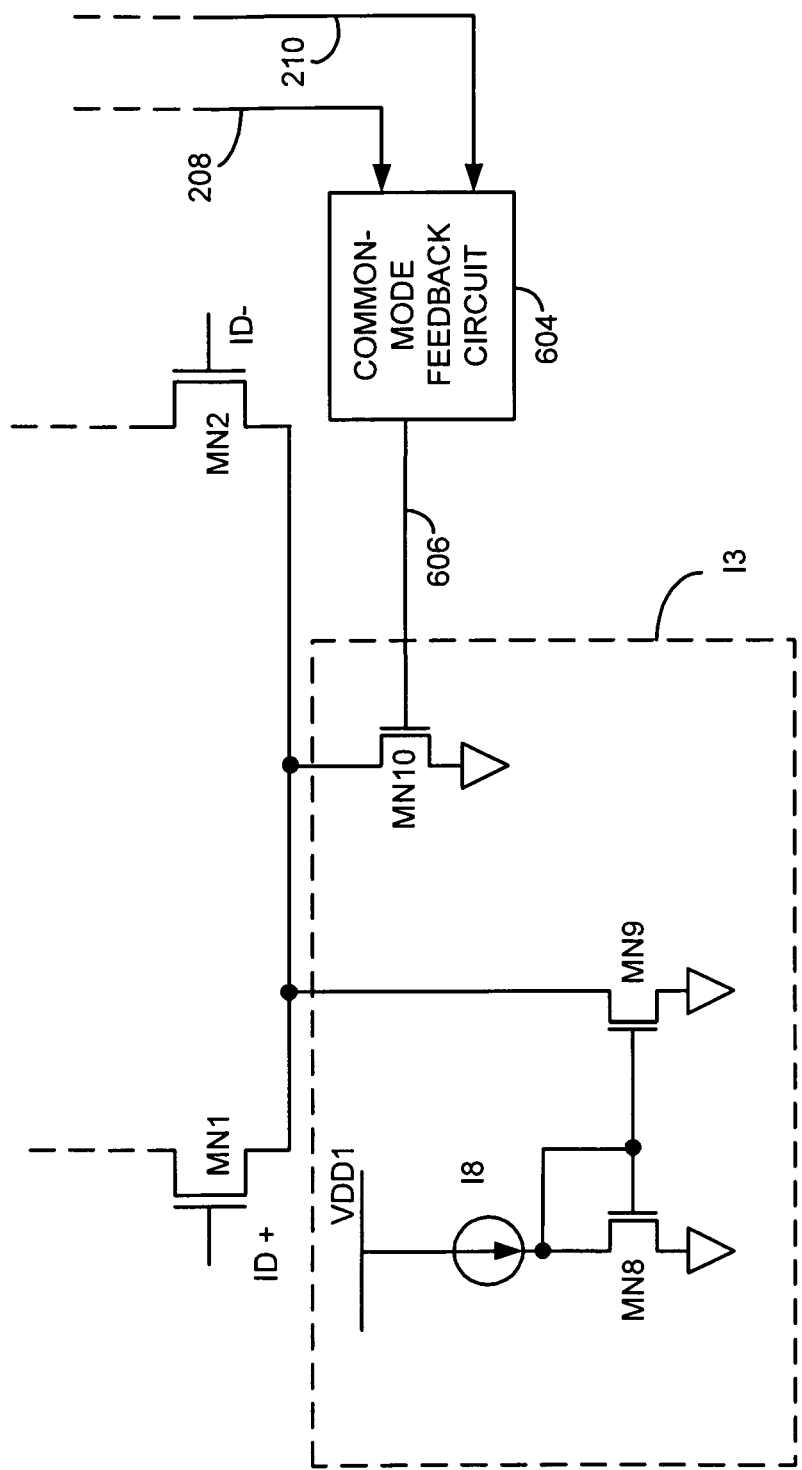
FIG. 8 is a schematic block diagram illustrating an example of the tail current source as part of the differential signaling circuitry of FIG. 6 in accordance with one embodiment of the present disclosure.

FIG. 8 is a schematic block diagram illustrating an example of tail current source I3 as part of the digital data transmitting device 502 of FIG. 5 in accordance to one embodiment of the present disclosure. As illustrated, the tail current source I3 includes an NMOS current mirror including NMOS transistors MN8 and MN9 with current source I8 coupled to the first terminal of NMOS transistor MN8. NMOS transistors MN8 and MN9 are coupled in the same manner as NMOS transistors MN6 and MN5, respectively, were coupled as discussed above and illustrated in FIG. 7. In contrast to the reference current source I6 of FIG. 7, the tail current source I3 does not include a switch NMOS transistor such as MN7, but instead includes a current adjustor NMOS transistor MN10 coupled between the second terminals of MN1 and MN2 such that the gate of current adjustor NMOS transistor MN10 receives the common-mode feedback signal 606 and acts to adjust the tail current generated by the tail current source I3 in the manner described above with respect to FIG. 6.

Figure 9:
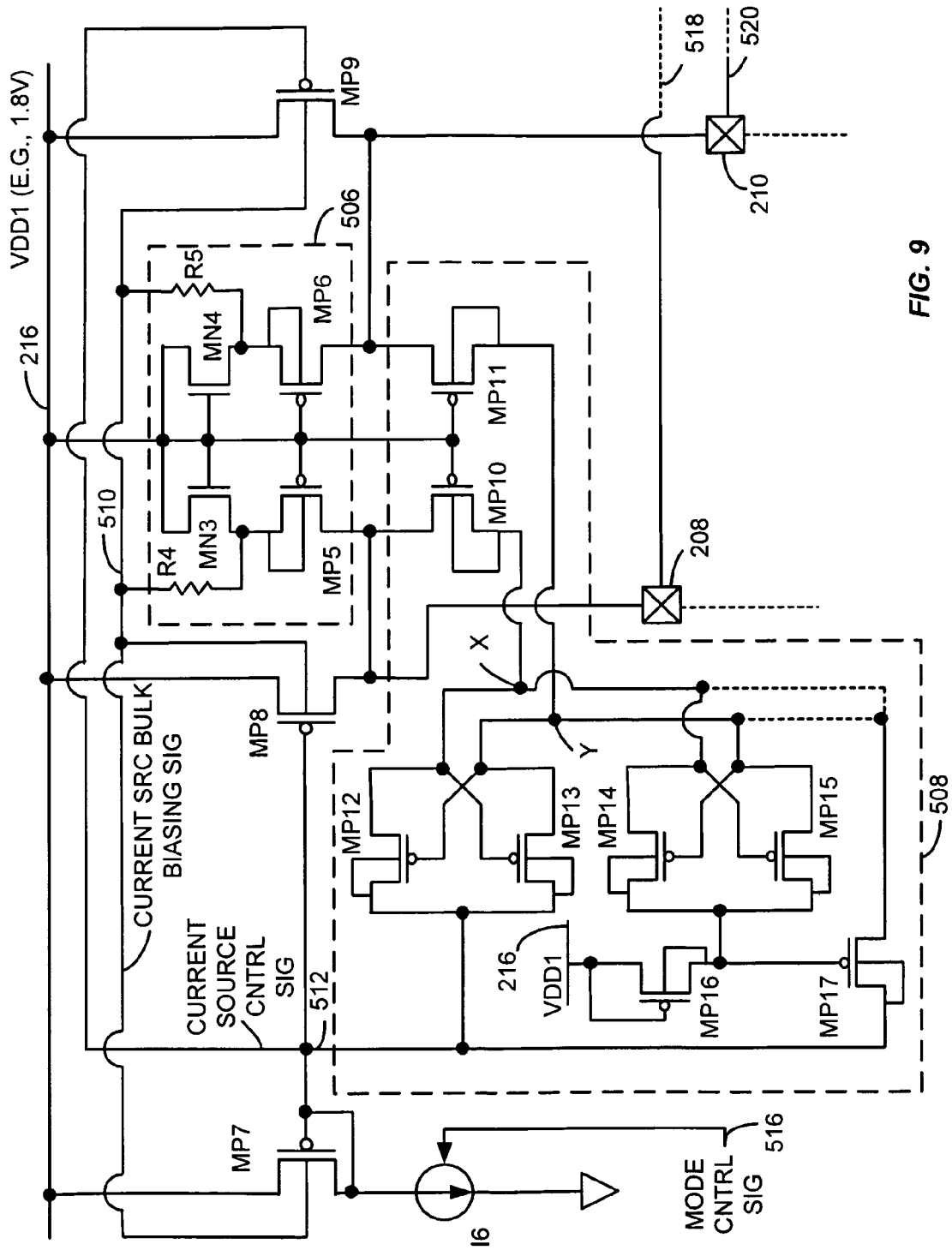
FIG. 9 is a schematic block diagram illustrating an example of the current source bulk biasing circuit and the current source controller as part of the digital data transmitting device of FIG. 6 in accordance with one embodiment of the present disclosure.

FIG. 9 is a schematic block diagram illustrating an example of the current source bulk biasing circuit 506 and the current source controller 508 as part of the digital data transmitting device 502 of FIG. 6 in accordance with one embodiment of the present disclosure. As illustrated, the exemplary current source bulk biasing circuit 506 includes NMOS transistor MN3 coupled in series to PMOS transistor MP5 between the first voltage source VDD1 216 and the first output terminal 208. Additionally, both gates of NMOS transistor MN3 and PMOS transistor MP5 are coupled to the first voltage source VDD1 216. The exemplary current source bulk biasing circuit 506 also includes NMOS transistor MN4 coupled in series to PMOS transistor MP6 between the first voltage source VDD1 216 and the second output terminal 210. Additionally, both gates of NMOS transistor MN4 and PMOS transistor MP6 are coupled to the first voltage source VDD1 216. Each of PMOS transistors MP5 and MP6 have bulk terminals coupled to their respective first terminals. The second terminal of NMOS transistor MN3, which is coupled to the first terminal of PMOS transistor MP5, is coupled to a first terminal of resistor R4, and the second terminal of NMOS transistor MN4, which is coupled to the first terminal of PMOS transistor MP6, is coupled to a first terminal of resistor R5. Resistor R4 and resistor R5 are coupled together as a voltage divider. The output of the voltage divider is the current source bulk biasing signal 510.

In one embodiment, resistor R4 and resistor R5 have the same value such that the voltage level of the current source bulk biasing signal 510 represents the mean voltage or a near-mean voltage of the voltage levels detected at the output terminals 208 and 210 when the differential signaling circuitry 505 is operating in the second mode of operation (e.g., TMDS mode). As used herein, a "near-mean voltage" of the voltage levels detected at the output terminals 208 and 210 when the differential signaling circuitry is operating in the second mode of operation (e.g., TMDS mode) is a voltage level representing the mean voltage plus or minus a voltage offset. It is recognized, however, that any suitable resistance values for each of the resistors may be used to obtain satisfactory results (and to prevent or retard current leakage through the transistor-implemented current sources I4 and I5 during TMDS mode) so long as each of the values is large enough not to significantly affect the impedance of the differential signaling circuitry 505.

During operation, the current source bulk biasing circuit 506 detects the voltage level at each of the first and second output terminals 208, 210. During a first mode of operation (e.g., LVDS mode), the output terminals 208, 210 support a voltage swing that is dependent upon the first voltage source VDD1 216 and is generally within the range of 0.9 V to 1.5 V (as permitted by VDD1 216 being set at or near 1.8 V). Thus, a logic 0 may be represented by lower voltages in this range and a logic 1 may be represented by higher voltages within this range. During a first mode (e.g., LVDS mode), each of the PMOS transistors MP5 and MP6 are off (i.e., they act like open circuits) and each of the NMOS transistors MN3 and MN4 are on (i.e., they act like short circuits). Thus, after voltage division by resistors R4 and R5, and assuming that R4=R5, the current source bulk biasing signal 510 is approximately equal to the voltage level at the first voltage source VDD1 216 (i.e., 1.8 V minus a suitable voltage drop). A current source bulk biasing signal 510 set approximately to the value of the first voltage source VDD1 216 enables PMOS transistors MP7, MP8 and MP9 to act as current mirrors.

During a second mode (e.g., TMDS), the output terminals 208, 210 support a voltage swing that is dependent upon the second voltage source VDD2 132 and is generally within the range of 2.7 V and 3.3 V assuming VDD2 is set at or near 3.3 V (as permitted by VDD2 being set at or near 3.3V). Thus, a logic 0 may be represented by lower voltages in this range and a logic 1 may be represented by higher voltages within this range. During a this mode, each of the PMOS transistors MP5 and MP6 are on (i.e., they act like short circuits) and each of the NMOS transistors MN3 and MN4 are off (i.e., they act like open circuits). Thus, after voltage division by resistors R4 and R5, and assuming that R4=R5, the current source bulk biasing signal 510 is approximately equal to the mean voltage of the voltage levels detected at the first and second output terminals 208, 210. A current source bulk biasing signal 510 set approximately to the mean value of the voltage levels detected at the first and second output terminals 208, 210 during this mode has a biasing effect on PMOS transistors MP8 and MP9 of the pair of transistor-implemented current sources I4 and I5 and effectively acts to retard current leakage from the higher-voltage, output terminals 208 and 210 up through PMOS transistors MP8 and MP9 toward the lower-voltage, first voltage source VDD1 216 during this mode.

The current source controller 508 includes PMOS transistor MP10 coupled between the first output terminal 208 and first inputs of a first and second pair of cross-coupled PMOS transistors. The current source controller 508 also includes PMOS transistor MP11 coupled between the second output terminal 210 and second inputs of the first and second pair of cross-coupled PMOS transistors. The first pair of cross-coupled PMOS transistors include PMOS transistors MP12 and MP13; the second pair of cross-coupled MPOS transistors include PMOS transistors MP14 and MP15. The gates of PMOS transistors MP10 and MP11 are coupled to the first voltage source VDD1 216. The output of the first pair of cross-coupled PMOS transistors is coupled to the gates of each of the PMOS transistors MP7-MP9 of the first and second transistor-implemented current sources I4 and I5. The output of the second pair of cross-coupled PMOS transistors is coupled to the second terminal of a diode-connected PMOS transistor MP16 which is coupled, at its first terminal, to the first voltage source VDD1 216 and acts like a weak current source. The second terminal of the diode-connected PMOS transistor MP16 is coupled to the gate of pass-through PMOS transistor MP17. As illustrated using dotted lines in FIG. 9, the first terminal of pass-through PMOS transistor MP17 is coupled to one of the second terminals of PMOS transistors MP10 and MP11 for reasons discussed below in further detail. The second terminal of pass-through PMOS transistor MP17 is coupled to the gates of each of the PMOS transistors MP7-MP9 of the first and second transistor-implemented current sources I4 and I5. The voltage at the gates of each of the PMOS transistors MP7-MP9 of the first and second transistor-implemented current sources I4 and I5 as provided by the first pair of cross-coupled PMOS transistors MP12 and MP13 and/or the pass-through PMOS transistor MP17 represents the current source control signal 512.

In operation, each of PMOS transistors MP10 and MP11 are off (i.e., they act like open circuits) during a first mode (e.g., LVDS). Therefore the voltage level provided by the current source control signal 512 is a floating/high impedance (Z) value during this mode. This allows each of the PMOS transistors MP7-MP9 of the transistor-implemented current sources I4 and I5 to be in an on state as controlled by reference current source I6 in the biasing transistor MP7. However, during a second mode (e.g., TMDS), each of the PMOS transistors MP10 and MP11 are on (i.e., they act like short circuits). The voltage level at the second terminal of PMOS transistor MP10, Node X, is approximately equal to the voltage level detected at the first output terminal 208 minus a suitable voltage drop. Similarly, the voltage level at the second terminal of PMOS transistor MP11, Node Y, is approximately equal to the voltage level detected at the second output terminal 210 minus a suitable voltage drop. When X and Y are unequal, the first and second pair of cross-coupled PMOS transistors have outputs that are approximately equal to the higher voltage of X and Y minus a suitable voltage drop (i.e., 3.3 V minus a suitable voltage drop). At the same time, pass-through PMOS transistor MP17 is off (i.e., it acts like an open circuit) and the voltage level provided by the current source control signal 512 is effectively provided by the first pair of cross-coupled PMOS transistors MP12 and MP13 and is set at approximately the higher voltage of X and Y minus the suitable voltage drop as described above. However, when X and Y are equal, the outputs of the first and second pair of cross-coupled PMOS transistors is a floating/high impedance (Z) value. However, due to the diode-connected PMOS transistor MP16 and because the first terminal of pass-through PMOS transistor MP17 is coupled to either X or Y (because X=Y, it is irrelevant whether the first terminal is coupled to X or Y), pass-through PMOS transistor MP17 is on (i.e., it acts like a short circuit) and the current source control signal 512 is approximately equal to the voltage level of X or Y minus a suitable voltage drop (i.e., 3.3 V minus a suitable voltage drop). Thus, during TMDS mode, the PMOS transistors MP7-MP9 are turned off.

In summary, during a first mode (e.g. LVDS), the current source control signal 512 has a voltage level that is floating, i.e., a high impedance (Z) value. This allows the PMOS transistors MP7-MP9 of the pair of transistor-implemented current sources I4 and I5 to turn on (so long as the reference current source I6 is also on). During a second mode (e.g., TMDS), the current source control signal 512 has a voltage level that is higher (e.g., around 2.7 V) and acts to turn off the PMOS transistors MP7-MP9 of the pair of transistor-implemented current sources I4 and I5.

Figure 10:
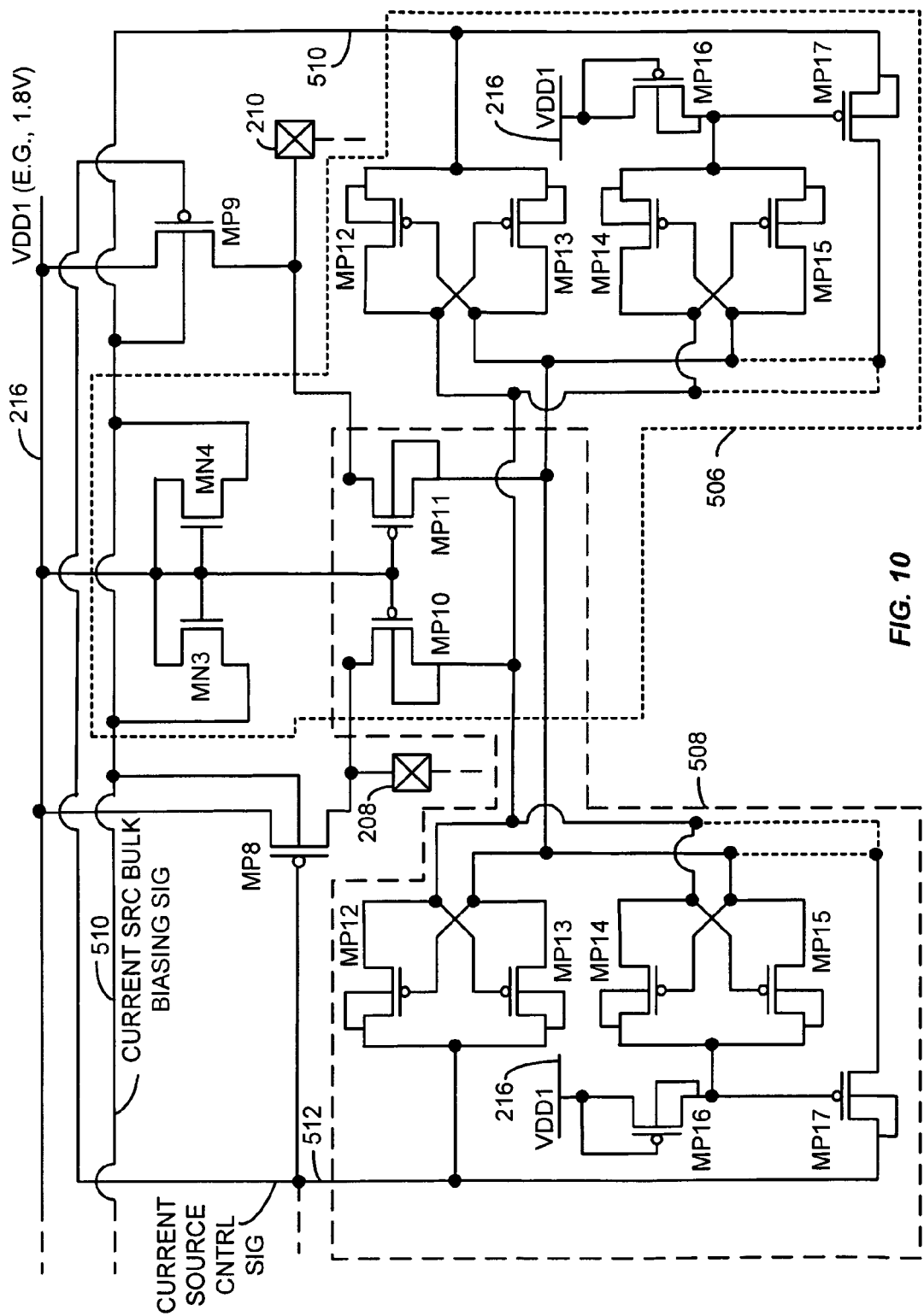
FIG. 10 is a schematic block diagram illustrating another example of the current source bulk biasing circuit and the current source controller as part of the digital data transmitting device of FIG. 5 in accordance with one embodiment of the present disclosure.

FIG. 10 is a schematic block diagram illustrating another example of the current source bulk biasing circuit 506 and the current source controller 508 as part of the digital data transmitting device 505 of FIG. 6 in accordance with one embodiment of the present disclosure. The current source bulk biasing circuit 506 is implemented and performs in the same manner as implemented in FIG. 9. However, the current source bulk biasing circuit 506 is implemented differently. The current source bulk biasing circuit 506 of FIG. 10 includes the same elements as the current source controller 508, but also includes NMOS transistors MN3 and MN4 coupled in the manner described above in reference to FIG. 9. As illustrated, the current source bulk biasing circuit 506 does not require the use of voltage divider R4 and R5 and does not require the use of PMOS transistors MP5 and MP6.

During operation of the current source bulk biasing circuit 506 of FIG. 10, NMOS transistors MN3 and MN4 are turned on while PMOS transistors MP10 and MP11 are turned off during a first mode (e.g., LVDS). Thus the current source bulk biasing signal 510 is approximately equal to the voltage level of the first voltage source VDD1 216 minus a suitable drop during this mode. During a second mode (e.g., TMDS), the NMOS transistors are turned off while PMOS transistors MP10 and MP11 are turned on. Thus, the current source bulk biasing signal 510 is equal to the current source control signal 512 during this mode. In the embodiment illustrated in FIG. 10, the current source bulk biasing signal 510 during the second mode has a higher voltage level than the voltage level of the same signal in FIG. 9 during the same mode and therefore better protects against current leakage through the transistor-implemented current sources I4 and I5. However, as illustrated, the trade-off between the design implementations is consumption of real estate. Implementing the schematic block diagram of FIG. 10 costs more in terms of real estate that the implementation of the schematic block diagram of FIG. 9.

Figure 11:
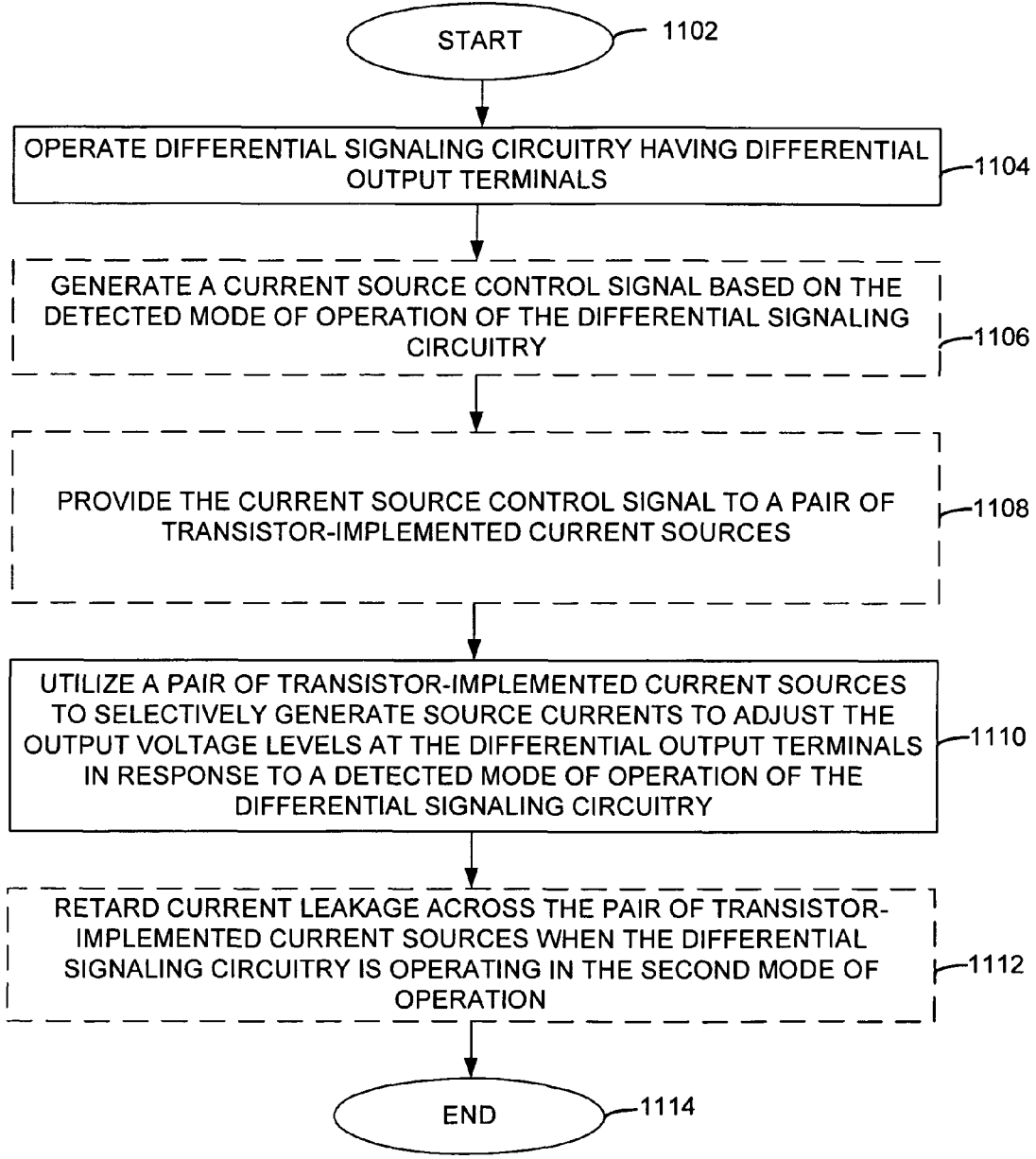
FIG. 11 is a flow diagram illustrating a method for operating a digital data transmitting device in accordance with one embodiment of the present disclosure.

FIG. 11 is a flow diagram illustrating a method for operating a digital data transmitting device in accordance with one embodiment of the present disclosure. The method begins in block 1102, where, for example, any suitable logic generates input signals, such as ID+ and ID−, for transmission to a digital data receiving device for transmission to digital data receiving device 504 of FIG. 5. The method continues in block 1104, by operating differential signaling circuitry having differential output terminals. In one embodiment, this corresponds to operating differential signaling circuitry 505 having differential output terminals 208, 210 as provided above in the various embodiments.

Optionally, the method includes block 1106 where a current source control signal is generated based on the detected mode of operation of the differential signaling circuitry. In one embodiment, this corresponds to detecting the voltage levels at the differential output terminals 208, 210 using, for example, a current source controller such as the current source controllers described above with reference to FIGS. 5 and 9 and as otherwise provided above. The method may optionally also include block 1108 where the current source control signal is provided to a pair of transistor-implemented current sources such as transistor-implemented current sources I4 and I5. This may also correspond to the current source controller 508 sending (and the pair of transistor-implemented current sources I4 and I5 receiving) the current source control signal as provided above in the various embodiments of FIGS. 5-10.

The method continues in block 1110 where the pair of transistor implemented current sources are utilized to selectively generate source currents to adjust the output voltage levels at the differential output terminals in response to a detected mode of operation of the differential signaling circuitry. In one embodiment, this may correspond to utilized the pair of transistor-implemented current sources I4 and I5 to generate source currents to adjust the output voltage levels at the differential output terminals 208 and 210 as described above. In one embodiment, block 1110 may also include enabling the pair of transistor-implemented current sources to generate the source currents when the differential signaling circuitry is in a first mode of operation using, for example, the current source bulk biasing current 510 as described above. Optionally, the method includes block 1112 such that current leakage is retarded across the pair of transistor-implemented current sources when the differential signaling circuitry is operating in the second mode of operation. In one embodiment, this corresponds to the current source bulk biasing signal 510 being received by the transistor-implemented current sources I4 and I5 such that the current source bulk biasing signal 510 acts to retard current leakage across I4 and I5 when the differential signaling circuitry 505 is in a second mode of operation (e.g., TMDS mode). Finally, the method ends in block 1114 where, for example, voltage levels at the differential output terminals 208 and 210 are transmitted to any suitable receiving entity such as digital data receiving device 504.

Accordingly, one embodiment of the present disclosure provides for a multimode, self-biasing output driver implement in or as part or whole of a digital data transmitting device such as digital data transmitting device 502. The digital data transmitting device 502 configures differential signaling circuitry 505 to operate in one of a current mode configuration or an open drain configuration. The current mode configuration corresponds to a first mode of operation (e.g., LVDS mode) where the active pair of transistor implemented current sources I4 and I5 are coupled between a voltage source VDD1 216 and first and second output terminals 208 and 210 in a way that is transparent to the signal path. The open drain configuration corresponds to a second mode of operation (e.g., TMDS mode) where the active pair of transistor-implemented current sources I4 and I5 are effectively disabled and where reverse current through the pair of transistor-implemented currents sources I4 and I5 is retarded.

The above detailed description of the examples described herein have been presented for the purposes of illustration and description only and not by limitation. For example, although the first and second modes of operation were described as corresponding to LVDS mode and TMDS mode, respectively, it is contemplated that any other suitable operation signaling modes could be implemented using the constructs put forth herein and without departing from the spirit and scope of the current disclosure. It is therefore contemplated that the present application cover any and all modifications, variations or equivalents that fall within the spirit and scope of the basic underlying principles disclosed above and the appended claims.

What is claimed is:

1. A digital data transmitting device comprising:
   differential signaling circuitry having differential output terminals;
   a current source controller operative to automatically monitor output voltage levels at the differential output terminals and generate a current source control signal based on a detected mode of operation of the differential signaling circuitry corresponding to the output voltage levels; and
   a pair of transistor-implemented current sources operative to selectively generate source currents to adjust the output voltage levels at the differential output terminals in response to the current source control signal.

2. The digital data transmitting device of claim 1, further comprising a current source bulk biasing circuit operative to generate a current source bulk biasing signal based on the detected mode of operation of the differential signaling circuitry, wherein the differential signaling circuitry is capable of being operated in one of a first mode of operation and a second mode of operation, and wherein the current source bulk biasing signal is operative to retard current leakage across the pair of transistor-implemented current sources when the differential signaling circuitry is operating in the second mode of operation.

3. The digital data transmitting device of claim 2, wherein the current bulk biasing signal is operative to enable the pair of transistor-implemented current sources to generate the source currents when the differential signaling circuitry is operating in the first mode of operation.

4. The digital data transmitting device of claim 1, wherein:
   the pair of transistor-implemented current sources are operatively coupled between a first voltage source and a respective output terminal of the differential output terminals, wherein the first voltage source is operative to supply power to the digital data transmitting device, and the differential output terminals are operatively coupled to a digital data receiving device that is operatively coupled to a second voltage source, wherein the second voltage source is operative to supply power to the digital data receiving device.

5. The digital data transmitting device of claim 1, wherein the output voltage levels at the differential output terminals are within a first voltage swing during a first mode of operation of the differential signaling circuitry and are within a second voltage swing during a second mode of operation.

6. The differential data transmitting device of claim 1, wherein:
   the differential output terminals comprise first and second differential output terminals;
   the differential signaling circuitry is responsive to first and second input signals;
   the pair of transistor-implemented current sources comprises:
      a first transistor-implemented current mirror current source operative to selectively generate a first source current to adjust the output voltage level at the first differential output terminal in response to the current source control signal and further based on the first input signal; and
      a second transistor-implemented current mirror current source operative to selectively generate a second source current to adjust the output voltage level at the second differential output terminal and further based on the second input signal.

7. The digital data transmitting device of claim 2, wherein each of the current source controller and the current source bulk biasing circuit is operatively to detect the mode of operation of the differential circuitry by detecting the voltage levels at the differential output terminals.

8. The digital data transmitting device of claim 1, wherein the differential output terminals comprise first and second output terminals and wherein the current source controller comprises:
   a first PMOS transistor having a first terminal, a second terminal and a gate, wherein the first terminal is operatively coupled to first output terminal;
   a second PMOS transistor having a first terminal, a second terminal and a gate, wherein the first terminal of the second PMOS transistor is operatively coupled to the second output terminal and wherein the gate of the second PMOS transistor is operatively coupled to the gate of the first PMOS transistor and to a voltage source operative to supply power to the digital data transmitting device;
   a first and second pair of cross-coupled PMOS transistors each having two input terminals and each having an output terminal, wherein one input terminal from each of the first and second pair of cross-coupled PMOS transistors is coupled to the second terminal of the first PMOS transistor and wherein another input terminal from each of the first and second pair of cross-coupled PMOS transistors is coupled to the second terminal of the second PMOS transistor;
   a third PMOS transistor having a first terminal, a second terminal and a gate, wherein the third PMOS transistor is coupled a s diode-connected PMOS transistor such that the first terminal of the third PMOS transistor and the gate of the third PMOS transistor are coupled to the first voltage source; and
   a fourth PMOS transistor having a first terminal, a second terminal and a gate, wherein the first terminal of the fourth PMOS transistor is operatively coupled to one of: the second terminal of the first PMOS transistor and the second terminal of the second PMOS transistor, wherein the gate of the fourth PMOS transistor is operatively coupled to the second terminal of the third PMOS transistor and to the output terminal of the second pair of cross-coupled PMOS transistors, wherein the second terminal of the fourth PMOS transistor is operatively coupled to the output terminal of the first pair of cross-coupled PMOS transistors, and wherein the voltage level at the second terminal of the fourth PMOS transistor represents the current source control signal.

9. The digital data transmitting device of claim 1, wherein:
   the differential signaling circuitry is capable of being operated in one of a first mode of operation and a second mode of operation,
   the first mode of operation is a low voltage differential signaling (LVDS) mode, and
   the second mode of operation is a transmission minimized differential signaling (TMDS) mode.

10. The digital data transmitting device of claim 1, wherein the output voltage levels at the differential output terminals represent video data.

11. The digital data transmitting device of claim 2, wherein the current source bulk biasing circuit comprises:
   a voltage divider having a first input, a second input and an output such that the voltage level at the output represents a mean voltage level or a near-mean voltage level of the voltage levels at the differential output terminals;

a first NMOS transistor having a first terminal, a second terminal and a gate, wherein the first terminal and the gate are operatively coupled to a first voltage source operative to supply power to the digital data transmitting device and the second terminal is operatively coupled to the first input of the voltage divider;

a second NMOS transistor having a first terminal, a second terminal and a gate, wherein the first terminal and the gate of the second NMOS transistor are operatively coupled to the first voltage source and the second terminal is operatively coupled to the second input of the voltage divider;

a first PMOS transistor having a first terminal, a second terminal and a gate, wherein the first terminal of the first PMOS transistor is operatively coupled to the second terminal of the first NMOS transistor, the second terminal of the first PMOS transistor is operatively coupled to a first output terminal of the differential output terminals and the gate of the first PMOS transistor is operatively coupled to the first voltage source; and a second PMOS transistor having a first terminal, a second terminal and a gate, wherein the first terminal of the second PMOS transistor is operatively coupled to the second terminal of the second NMOS transistor, the second terminal of the second PMOS transistor is operatively coupled to a second output terminal of the differential output terminals and the gate of the second PMOS transistor is operatively coupled to the first voltage source, wherein the voltage level at the output of the voltage divider represents the current source bulk biasing signal.

12. The digital data transmitting device of claim 2, wherein the current source bulk biasing circuit comprises:

a first NMOS transistor having a first terminal, a second terminal and a gate, wherein the first terminal and the gate are operatively coupled to a first voltage source operative to supply power to the digital data transmitting device;

a second NMOS transistor having a first terminal, a second terminal and a gate, wherein the first terminal and the gate of the second NMOS transistor are operatively coupled to the first voltage source and the second terminal is operatively coupled to the second terminal of the first NMOS transistor;

a first PMOS transistor having a first terminal, a second terminal and a gate, wherein the first terminal is operatively coupled to a first output terminal of the differential output terminals;

a second PMOS transistor having a first terminal, a second terminal and a gate, wherein the first terminal of the second PMOS transistor is operatively coupled to the second output terminal and wherein the gate of the second PMOS transistor is operatively coupled to the gate of the first PMOS transistor and to the first voltage source;

a first and second pair of cross-coupled PMOS transistors each having two input terminals and each having an output terminal, wherein one input terminal from each of the first and second pair of cross-coupled PMOS transistors is coupled to the second terminal of the first PMOS transistor and wherein another input terminal from each of the first and second pair of cross-coupled PMOS transistors is coupled to the second terminal of the second PMOS transistor;

a third PMOS transistor having a first terminal, a second terminal and a gate, wherein the third PMOS transistor is coupled as a diode-connected PMOS transistor such that the first terminal of the third PMOS transistor and the gate of the third PMOS transistor are coupled to the first voltage source; and a fourth PMOS transistor having a first terminal, a second terminal and a gate, wherein the first terminal of the fourth PMOS transistor is operatively coupled to one of: the second terminal of the first PMOS transistor and the second terminal of the second PMOS transistor, wherein the gate of the fourth PMOS transistor is operatively coupled to the second terminal of the third PMOS transistor and to the output terminal of the second pair of cross-coupled PMOS transistors, wherein the second terminal of the fourth PMOS transistor is operatively coupled to the output terminal of the first pair of cross-coupled PMOS transistors and to the second terminals of the first and second NMOS transistors forming a node, wherein the voltage level at the node represents the current source bulk biasing signal.

13. A method for transmitting digital data, comprising:

operating differential signaling circuitry having differential output terminals;

automatically monitoring output voltage levels at the differential output terminals to detect a mode of operation of the differential signaling circuitry corresponding to the output voltage levels; and utilizing a pair of transistor-implemented current sources to selectively generate source currents to adjust the output voltage levels in response to the detected mode of operation of the differential signaling circuitry.

14. The method of claim 13, further comprising:

generating a current source control signal based on the detected mode of operation of the differential signaling circuitry; and providing the current source control signal to the pair of transistor-implemented current sources such that the pair of transistor-implemented current sources is operative to selectively generate the source currents in response to the current source control signal.

15. The method of claim 13, wherein the differential signaling circuitry is capable of being operated in one of a first mode of operation and a second mode of operation, and further comprising retarding current leakage across the pair of transistor-implemented current sources when the differential signaling circuitry is operating in the second mode of operation.

16. The method of claim 15, wherein retarding current leakage across the pair of transistor-implemented current sources comprises:

generating a current source bulk biasing signal based on the detected mode of operation of the differential signaling circuitry, and providing the current source bulk biasing signal to the pair of transistor-implemented current sources such that when the differential signaling circuit is operating in the second mode of operation, the current source bulk biasing signal is operative to retard current leakage across the pair of transistor-implemented current sources.

17. The method of claim 13, wherein utilizing a pair of transistor-implemented current sources to selectively generate source currents comprises enabling the pair of transistor-implemented current sources to generate the source currents when the differential signaling circuitry is operating in the first mode of operation.

18. The method of claim 13, wherein the output voltage levels at the differential output terminals are within a first voltage swing during a first mode of operation of the differential signaling circuitry and are within a second voltage swing during a second mode of operation.

19. The method of claim 13, wherein:
the differential signaling circuitry is capable of being operated in one of a first mode of operation and a second mode of operation,
the first mode of operation is a low voltage differential signaling (LVDS) mode, and
the second mode of operation is a transmission minimized differential signaling (TMDS) mode.

20. The method of claim 13, wherein the output voltage levels at the differential output terminals represent video data.

21. A digital data receiving device comprising:
a receiver operatively capable of receiving digital data output signals from a digital data transmitting device, wherein the digital data transmitting device includes:
differential signaling circuitry having differential output terminals;
a current source controller operative to automatically monitor output voltage levels at the differential output terminals and generate a current source control signal based on a detected mode of operation of the differential signaling circuitry corresponding to the output voltage levels; and
a pair of transistor-implemented current sources operative to selectively generate source currents to adjust the output voltage levels at the differential output terminals in response to the current source control signal, wherein the output voltage levels at the differential output terminals represent the digital data output signals.

22. The digital data receiving device of claim 21, wherein the digital data transmitting device further includes a current source bulk biasing circuit operative to generate a current source bulk biasing signal based on the detected mode of operation of the differential signaling circuitry, wherein the differential signaling circuitry is capable of being operated in one of a first mode of operation and a second mode of operation, and wherein the current source bulk biasing signal is operative to retard current leakage across the pair of transistor-implemented current sources when the differential signaling circuitry is operating in the second mode of operation.

23. The digital data receiving device of claim 22, wherein the current bulk biasing signal is operative to enable the pair of transistor-implemented current sources to generate the source currents when the differential signaling circuitry is operating in the first mode of operation.

24. The digital data receiving device of claim 21, wherein:
the differential signaling circuitry is capable of being operated in one of a first mode of operation and a second mode of operation,
the first mode of operation is a low voltage differential signaling (LVDS) mode, and
the second mode of operation is a transmission minimized differential signaling (TMDS) mode.

25. The digital data receiving device of claim 21, wherein the digital data output signals represent video data.

* * * * *